US012604459B2

(12) United States Patent

Choo et al.

(10) Patent No.: US 12,604,459 B2
(45) Date of Patent: Apr. 14, 2026

(54) SEMICONDUCTOR DEVICE AND METHOD FOR FABRICATING THE SAME

(71) Applicant: Samsung Electronics Co., Ltd., Suwon-si (KR)

(72) Inventors: Seong Min Choo, Seoul (KR); Hyuk Woo Kwon, Seoul (KR); Dong Woo Kim, Hwaseong-si (KR); Byoung Deog Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 736 days.

(21) Appl. No.: 17/841,858

(22) Filed: Jun. 16, 2022

(65) Prior Publication Data

US 2023/0055450 A1 Feb. 23, 2023

(30) Foreign Application Priority Data

Aug. 23, 2021 (KR) ........................ 10-2021-0111062

(51) Int. Cl.
| | |
|---|---|
| *H10B 12/00* | (2023.01) |
| *H10D 1/00* | (2025.01) |
| *H10D 1/68* | (2025.01) |

(52) U.S. Cl.
CPC ......... *H10B 12/315* (2023.02); *H10B 12/053* (2023.02); *H10B 12/34* (2023.02); *H10D 1/043* (2025.01); *H10D 1/696* (2025.01); *H10D 1/714* (2025.01); *H10D 1/716* (2025.01); *H10B 12/0335* (2023.02); *H10D 1/042* (2025.01)

(58) Field of Classification Search
CPC ...... H10B 12/315; H10B 12/30; H10D 1/714; H10D 1/712
See application file for complete search history.

(56) References Cited

U.S. PATENT DOCUMENTS

| | | | |
|---|---|---|---|
| 10,861,857 B2 | 12/2020 | Chang et al. | |
| 10,879,345 B2 | 12/2020 | Yi et al. | |
| 10,998,318 B2 | 5/2021 | Choo et al. | |
| 2005/0032305 A1* | 2/2005 | Kishida ................ | H10B 12/033 438/398 |

(Continued)

FOREIGN PATENT DOCUMENTS

| | | |
|---|---|---|
| KR | 20000039027 A | 7/2000 |
| KR | 20030049567 A | 6/2003 |

(Continued)

*Primary Examiner* — Shih Tsun A Chou
(74) *Attorney, Agent, or Firm* — Muir Patent Law, PLLC

(57) ABSTRACT

A semiconductor device including a first pad on a substrate extending in a first direction and a second direction, a lower electrode connected to and disposed on the first pad, first to third supporter layers disposed on a side wall of the lower electrode and sequentially spaced apart from each other in a third direction perpendicular to the first direction and the second direction, a dielectric film disposed on the lower electrode and the first to third supporter layers, and an upper electrode disposed on the dielectric film. At least one of a side wall of the lower electrode between the first supporter layer and the second supporter layer, and a side wall of the lower electrode between the second supporter layer and the third supporter layer includes a first portion including protrusions extending in the first direction and includes a second portion including no protrusions.

18 Claims, 23 Drawing Sheets

(56)                 References Cited

U.S. PATENT DOCUMENTS

| 2011/0294276 | A1 | 12/2011 | Kuroki |
| 2013/0228837 | A1 | 9/2013 | Sukekawa et al. |
| 2016/0322361 | A1* | 11/2016 | Yim ..................... H10D 1/716 |
| 2020/0111684 | A1 | 4/2020 | Choi et al. |
| 2022/0310780 | A1* | 9/2022 | Ho ..................... H10B 12/033 |

FOREIGN PATENT DOCUMENTS

| KR | 20050062679 | A | 6/2005 |
| KR | 20090022678 | A | 3/2009 |
| KR | 20150023181 | A | 3/2015 |
| KR | 1020170031469 | A | 3/2017 |
| KR | 1020200010913 | A | 1/2020 |

* cited by examiner

DR2

DR1

DR2

DR1

133
132
150
131
140
140h
105
104
102
103
101

DR2
DR1

SEMICONDUCTOR DEVICE AND METHOD FOR FABRICATING THE SAME

This application claims priority to Korean Patent Application No. 10-2021-0111062, filed on Aug. 23, 2021, and all the benefits accruing therefrom under 35 U.S.C. § 119, the disclosure of which is incorporated herein by reference in its entirety.

BACKGROUND

1. Technical Field

The present inventive concept relates to a semiconductor device and a method for fabricating the same.

2. Description of the Related Art

In recent years, along with a demand for high capacity and high integration of semiconductor elements, has also come a decrease in design rules for the semiconductor elements. Such a tendency also appears in a DRAM, which is one of the memory semiconductor elements. A certain level or more of capacitance is required for each cell in order for a DRAM device to operate.

An increase in capacitance increases an amount of charges stored in a capacitor and improves refresh characteristics of a semiconductor device. The improved refresh characteristics of the semiconductor device may improve the yield of the semiconductor device.

In order to increase the capacitance, a method for increasing an aspect ratio of a lower electrode of the capacitor or a method for increasing a contact area between a lower electrode of the capacitor and a dielectric film is being studied.

SUMMARY

Aspects of the present inventive concept provide a semiconductor device having improved product reliability.

Aspects of the present inventive concept also provide a method for fabricating the semiconductor device capable of having improved product reliability.

According to an aspect of the present disclosure, there is provided a semiconductor device comprising a storage pad disposed on a substrate extending in a first direction and a second direction, perpendicular to the first direction; a lower electrode connected to and disposed on the storage pad; a first supporter layer, a second supporter layer, and a third supporter layer each disposed on a side wall of the lower electrode and sequentially spaced apart from each other in a third direction perpendicular to the first direction and the second direction; a dielectric film disposed on the lower electrode and the first, second, and third supporter layers; and an upper electrode disposed on the dielectric film, wherein at least one of a side wall of the lower electrode between the first supporter layer and the second supporter layer, and a side wall of the lower electrode between the second supporter layer and the third supporter layer includes a first portion including protrusions extending in the first direction and includes a second portion including no protrusions.

According to an aspect of the present disclosure, there is provided a semiconductor device comprising a trench inside a substrate extending in a first direction and a second direction, perpendicular to the first direction; a gate electrode that fills a part of the trench; a storage contact which is disposed on at least one side of the gate electrode and connected to the substrate; a storage pad on the storage contact; an etching stop film disposed on and covering a portion of the storage pad; a lower electrode which penetrates the etching stop film and is connected to the storage pad; a first supporter layer disposed on a side wall of the lower electrode and spaced part, in a third direction perpendicular to the first and second direction, from the etching stop film; a second supporter layer disposed on the first supporter layer and spaced apart, in the third direction, from the first supporter layer; a third supporter layer disposed on the second supporter layer and spaced apart, in the third direction, from the second supporter layer; a dielectric film which extends along an upper surface and a side wall of the lower electrode, and upper surfaces and lower surfaces of the first to third supporter layers; and an upper electrode disposed on the dielectric film, wherein the side wall of the lower electrode between the first supporter layer and the second supporter layer includes a first lower portion and a first upper portion on the first lower portion, wherein the side wall of the lower electrode between the second supporter layer and the third supporter layer includes a second lower portion and a second upper portion on the second lower portion, wherein at least one of the first upper portion and the second lower portion includes a plurality of protrusions protruding from the side wall of the lower electrode, and wherein the second upper portion and the first lower portion are flat.

According to an aspect of the present disclosure, there is provided a method for fabricating a semiconductor device, the method comprising sequentially stacking an etching stop film, a first mold layer, a first supporter layer, a second mold layer, a second supporter layer, a third mold layer and a third supporter layer on a substrate extending in a first direction and a second direction, perpendicular to the first direction; forming a lower electrode which penetrates the etching stop film, the first mold layer, the first supporter layer, the second mold layer, the second supporter layer, the third mold layer, and the third supporter layer; removing the first mold layer, the second mold layer and the third mold layer; forming a dielectric film extending along the lower electrode and the first to third supporter layers; and forming an upper electrode on the dielectric film, wherein the second mold layer includes a first film including no nitrogen, and a second film, disposed on the first film, including nitrogen.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

BRIEF DESCRIPTION OF THE DRAWINGS

The above and other aspects and features of the present inventive concept will become more apparent by describing in detail exemplary embodiments thereof referring to the attached drawings, in which.

DETAILED DESCRIPTION OF THE EMBODIMENTS

Figure 1:
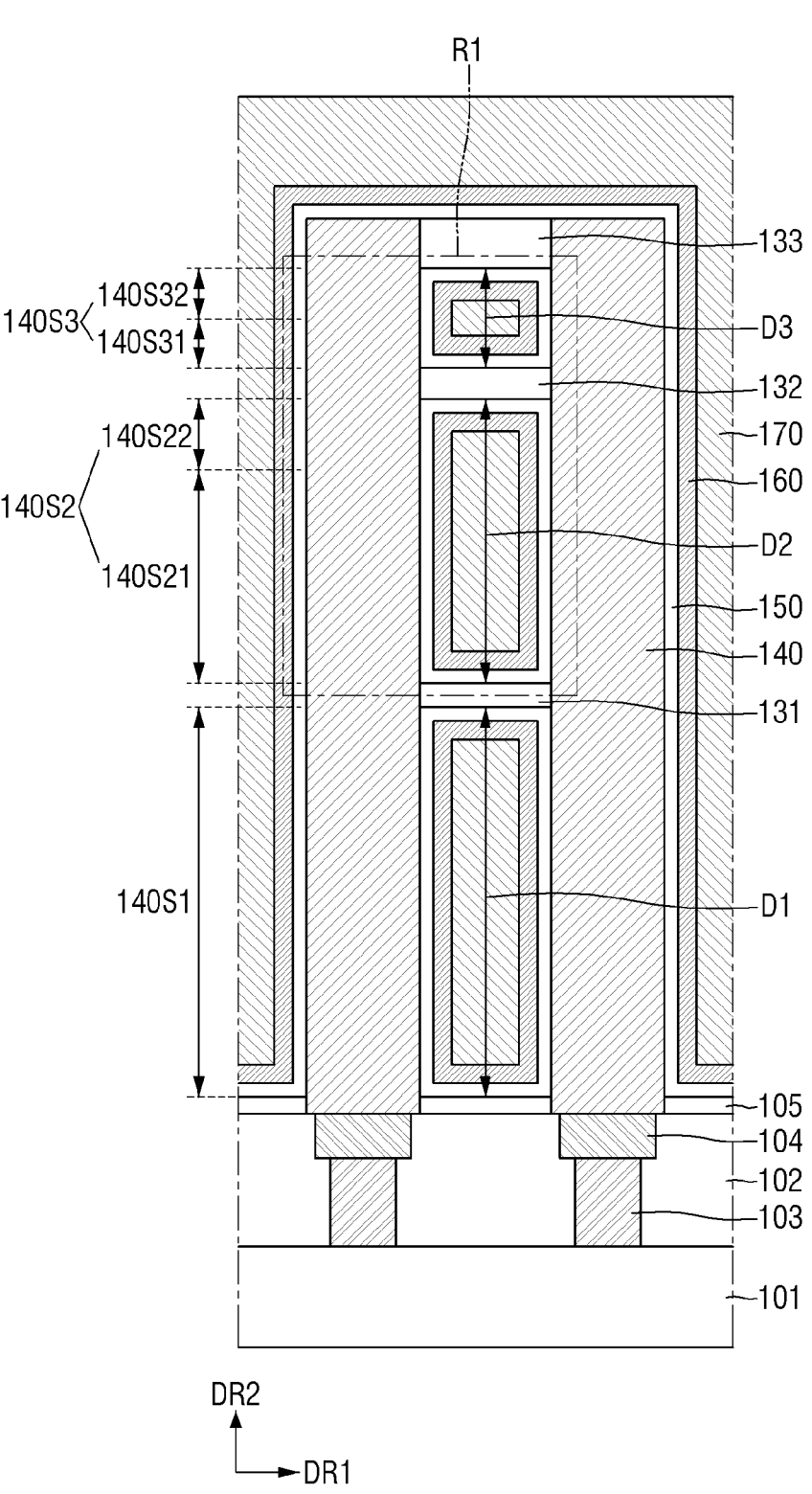
FIG. 1 is a diagram for explaining a semiconductor device according to example embodiments.

FIG. 1 is a diagram for explaining a semiconductor device according to example embodiments. FIGS. 2 to 5 are enlarged views of example embodiments of a region R1 of FIG. 1.

Referring to FIG. 1, the semiconductor device according to example embodiments may include a substrate 101, an interlayer insulating film 102, a storage contact 103, a storage pad 104, an etching stop film 105, a first supporter pattern 131, a second supporter pattern 132, a third supporter pattern 133, a lower electrode 140, a dielectric film 150, an upper electrode 160, and an upper plate electrode 170. As used herein, a semiconductor device may refer to a semiconductor chip (e.g., memory chip and/or logic chip formed on a die), a stack of semiconductor chips, a semiconductor package including one or more semiconductor chips stacked on a package substrate, or a package-on-package device including a plurality of packages.

The substrate 101 may be bulk silicon or silicon-on-insulator (SOI). In contrast, the substrate 101 may be a silicon substrate or may include other materials, for example, but is not limited to, silicon germanium, silicon germanium on-insulator (SGOI), indium antimonide, lead tellurium compounds, indium arsenide, indium phosphate, gallium arsenide or gallium antimonide. In the following description, the substrate 101 will be described as a silicon substrate.

Although it is not shown, a gate electrode used as a word line may be disposed inside the substrate 101. A unit active region and an element isolation region may be formed on the substrate 101. For example, two transistors may be formed inside a single unit active region.

The interlayer insulating film 102 may include, for example, at least one of a silicon oxide, a silicon nitride, a silicon oxynitride film (SiON), a silicon oxycarbonitride film (SiOCN), and a combination thereof. The interlayer insulating film 102 may be a single layer or multiple layers.

The storage contact 103 may be disposed inside the interlayer insulating film 102 on the substrate 101. The storage pad 104 may be disposed inside the interlayer insulating film 102 on the substrate 101. The storage pad 104 may be disposed on the storage contact 103. The storage pad 104 may be connected to the substrate 101 via the storage contact 103. The storage pad 104 may be electrically connected to a conductive region formed on or in the substrate 101. The storage pad 104 is a conductive pad electrically connected to a conductive region formed on or in the substrate 101 and electrically connected to a lower electrode 140. The storage pad 104 may be referred to herein as a "first pad." As used herein, items described as being "electrically connected" are configured such that an electrical signal can be passed from one item to the other. Therefore, a passive electrically conductive component (e.g., a wire, pad, internal electrical line, etc.) physically connected to an passive electrically insulative material of an electrically insulative component (e.g., a prepreg layer of a printed circuit board, an electrically insulative adhesive connecting two devices, an electrically insulative isolation layer, an electrically insulative underfill or mold layer, etc.) is not electrically connected to that component.

The etching stop film 105 may be disposed on the interlayer insulating film 102. The etching stop film 105 may expose (i.e., not cover) at least a part of the storage pad 104.

As an example, the etching stop film 105 may be disposed on the storage pad 104. The etching stop film 105 may include a lower electrode hole that exposes at least a part of the storage pad 104.

The etching stop film 105 may include or may be formed of, for example, at least one of silicon nitride (SiN), silicon carbonitride (SiCN), silicon boronitride (SiBN), silicon carbon oxide (SiCO), silicon oxynitride (SiON), silicon oxide (SiO), and silicon oxycarbonitride (SiOCN). For example, silicon carbon oxide (SiCO) means including silicon (Si), carbon (C) and oxygen (O), but does not mean a ratio between silicon (Si), carbon (C) and oxygen (O).

The lower electrode 140 may be disposed on the storage pad 104. The lower electrode 140 is connected to the storage pad 104. A part of a lower side wall of the lower electrode 140 may be in contact with the etching stop film 105.

The length of the lower electrode 140 extending in the second direction DR2 (perpendicular to a top surface of the substrate 101) is greater than the width of the lower electrode 140 in the first direction DR1 (parallel to the upper surface of the substrate 101). The lower electrode 140 may have, for example, a pillar shape.

Here, the second direction DR2 may mean a direction that is aligned with a thickness direction of the substrate 101. The first direction DR1 means a direction that intersects the second direction DR2 and is aligned with the upper surface of the substrate 101 or the upper surface of the interlayer insulating film 102.

A part of the lower electrode 140 may be disposed inside the etching stop film 105. The lower electrode 140 passes through the etching stop film 105 and may be connected to the storage pad 104. For example, a part of the side wall of the lower electrode 140 may come into contact with the etching stop film 105.

The lower electrode 140 may include or may be formed of, for example, but is not limited to, a doped semiconductor material, a conductive metal nitride (e.g., titanium nitride, tantalum nitride, niobium nitride, tungsten nitride, etc.), a metal (e.g., ruthenium, iridium, titanium, tantalum, etc.), a conductive metal oxide (e.g., iridium oxide or niobium oxide) or the like. In the semiconductor device according to example embodiments, the lower electrode 140 may include or may be formed of titanium nitride (TiN). Further, in the semiconductor device according to example embodiments, the lower electrode 140 may include or may be formed of a niobium nitride (NbN).

A first supporter pattern 131, a second supporter pattern 132, and a third supporter pattern 133 ("first to third supporter patterns 131, 132 and 133") may be disposed on the etching stop film 105. The first to third supporter patterns 131, 132 and 133 may be sequentially spaced in a second direction DR2 on the etching stop film 105. A first supporter pattern 131 is spaced apart from the etching stop film 105 in the second direction DR2. A second supporter pattern 132 is spaced apart from the first supporter pattern 131 in the second direction DR2 on the first supporter pattern 131. A third supporter pattern 133 is spaced apart from the second supporter pattern 132 in the second direction DR2 on the second supporter pattern 132.

The first to third supporter patterns 131, 132 and 133 may come into contact with the lower electrode 140. The first to third supporter patterns 131, 132 and 133 may come into contact with a part of the side wall of the lower electrode 140. The first to third supporter patterns 131, 132 and 133 may be sequentially spaced apart on the side walls of the lower electrode 140. The first to third supporter patterns 131, 132 and 133 may overlap each other in a plan view. For example, the first to third supporter patterns 131, 132 and 133 may overlap each other in the second direction DR2. The first to third supporter patterns 131, 132, and 133 may each have a plank shape, a planar shape, or an elongated plate shape, and may be described as support blocks or support patterns. Each supporter pattern may also be described herein as a supporter layer or a support layer and may include one or more layers of material.

The first to third supporter patterns 131, 132 and 133 may connect the lower electrodes 140 adjacent to each other in the first direction DR1. In FIG. 1, although the two lower electrodes 140 are shown as being connected by the first to third supporter patterns 131, 132 and 133, the present inventive concept is not limited thereto.

The upper surface of the third supporter pattern 133 may be disposed on the same plane as the upper surface of the lower electrode 140. Alternatively, the upper surface of the lower electrode 140 may protrude above the upper surface of the third supporter pattern 133 in the direction DR2 away from the substrate 101. In the following description, the upper surface of the third supporter pattern 133 will be described to be disposed on the same plane as the upper surface of the lower electrode 140. Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In the second direction DR2, the thickness of the first supporter pattern 131, the thickness of the second supporter pattern 132, and the thickness of the third supporter pattern 133 may be different from each other. The thickness of the second supporter pattern 132 may be smaller than the thickness of the third supporter pattern 133 and greater than the thickness of the first supporter pattern 131. However, the relationship is not limited thereto, and the relationship of the thickness between the first supporter pattern 131, the thickness of the second supporter pattern 132, and the thickness of the third supporter pattern 133 in the second direction DR2 may vary.

A distance D1 between the etching stop film 105 and the first supporter pattern 131, a distance D2 between the first supporter pattern 131 and the second supporter pattern 132, and a distance D3 between the second supporter pattern 132 and the third supporter pattern 133 may be different from each other. The distance D2 between the first supporter pattern 131 and the second supporter pattern 132 may be smaller than the distance D1 between the etching stop film 105 and the first supporter pattern 131, and may be greater than the distance D3 between the second supporter pattern 132 and the third supporter pattern 133. However, the relationship is not limited thereto, and the relationship of the distance D1 between the etching stop film 105 and the first supporter pattern 131, the distance D2 between the first supporter pattern 131 and the second supporter pattern 132, and the distance D3 between the second supporter pattern 132 and the third supporter pattern 133 may vary.

The side wall of the lower electrode 140 may include a first side wall 140S1 between the top surface of the etching stop film 105 and the bottom surface of the first supporter pattern 131, a second side wall 140S2 between the top surface of the first supporter pattern 131 and the bottom surface of the second supporter pattern 132, and a third side wall 140S3 between the top surface of the second supporter pattern 132 and the bottom surface of the third supporter pattern 133.

In example embodiments, the first side wall 140S1 between the etching stop film 105 and the first supporter pattern 131 may be flat. In example embodiments, the third side wall 140S3 between the second supporter pattern 132 and the third supporter pattern 133 may be flat. In example embodiments, at least one of the third side wall 140S3 disposed at the upper part of the second supporter pattern 132 and the second side wall 140S2 disposed at the lower part thereof may be flat.

Each of the first to third supporter patterns 131, 132 and 133 may include or may be formed of, for example, at least one of silicon nitride (SiN), silicon carbonitride (SiCN), silicon boronitride (SiBN), silicon carbon oxide (SiCO), silicon oxynitride (SiON), silicon oxide (SiO), and silicon oxycarbonitride (SiOCN). In the semiconductor device according to example embodiments, each of the first to third supporter patterns 131, 132 and 133 may each include or may be formed of silicon carbonoxide (SiCN) or silicon nitride.

Figure 2:
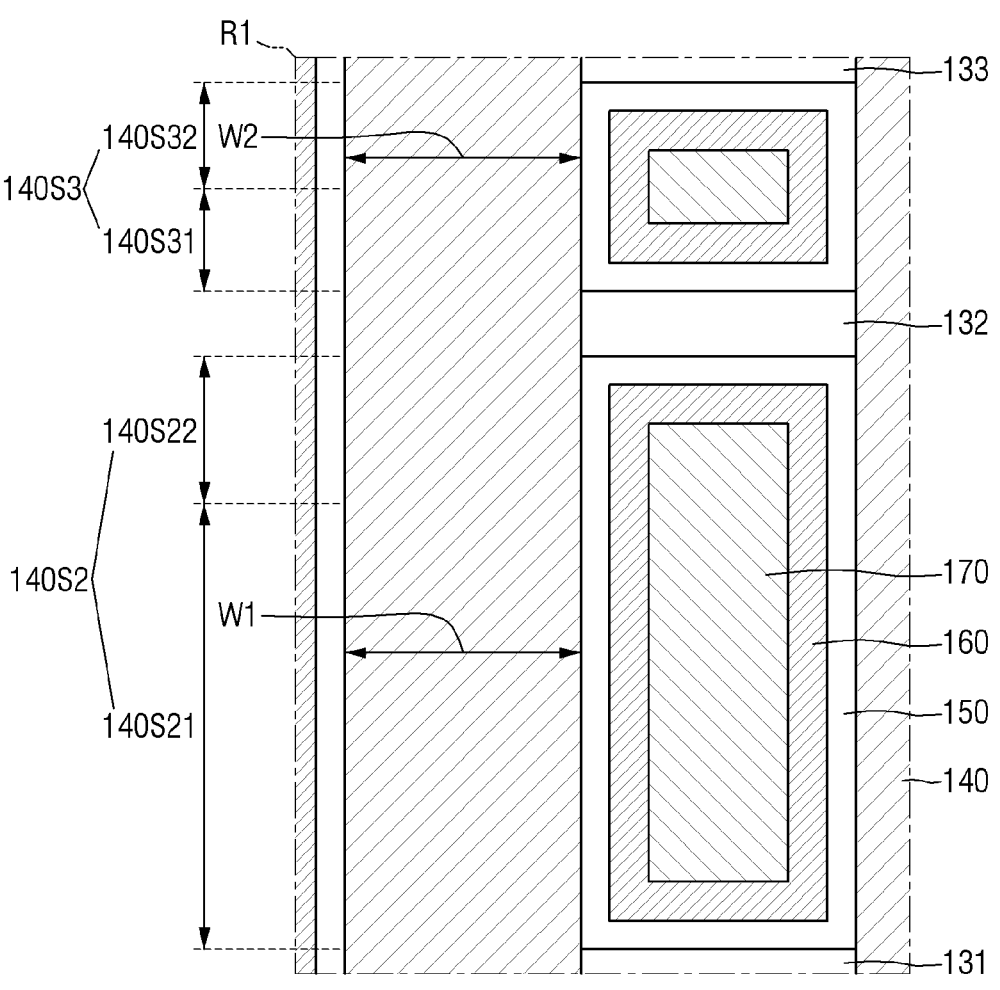
FIGS. 2 to 5 are enlarged views of a region R1 of FIG. 1.

Referring to FIG. 2, in example embodiments, the second side wall 140S2 and the third side wall 140S3 may be flat. For example, the third side wall 140S3 disposed at the upper part of the second supporter pattern 132 and the second side wall 140S2 disposed at the lower part of the second supporter pattern 132 may be flat.

A width of the lower electrode 140 in the first direction DR1 may increase along the second direction DR2. For example, a width W2 of the lower electrode 140 having the third side wall 140S3 may be greater than a width W1 of the lower electrode 140 having the second side wall 140S2. However, the embodiment is not limited thereto, and the width W2 of the lower electrode 140 having the third side wall 140S3 may be substantially the same as the width W1 of the lower electrode 140 having the second side wall 140S2.

Figure 3:
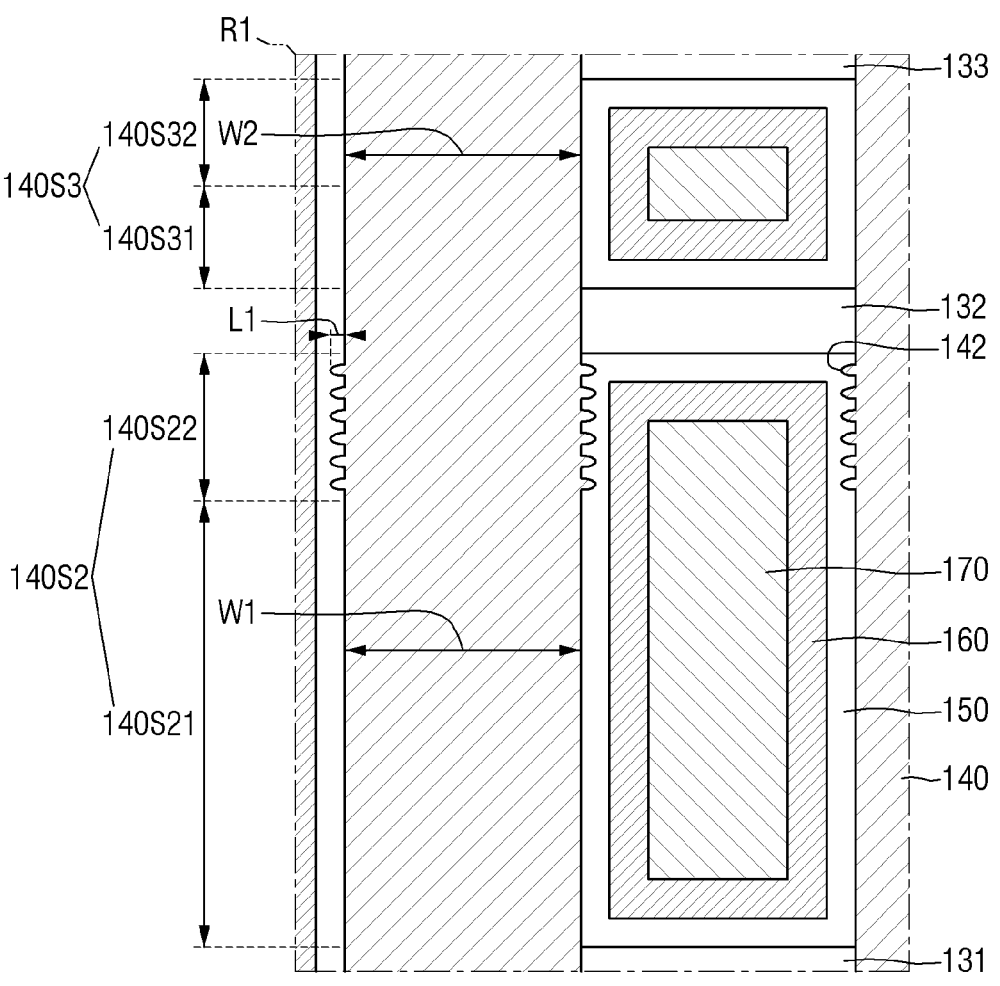

Referring to FIG. 3, in example embodiments, the second side wall 140S2 may include a first lower portion 140S21 and a first upper portion 140S22. The first upper portion 140S22 may be disposed above the first lower portion 140S21 in the second direction DR2.

The first upper portion 140S22 may include irregularities (i.e., protrusions). Specifically, the first upper portion 140S22 may include a plurality of protrusions 142 that protrude toward the dielectric film 150 in the first direction DR1. For example, a distance between the protrusions 142 facing each other in the first direction DR1 may be smaller than the thickness of the lower electrode 140 between the protrusions 142 adjacent to each other in the second direction DR2.

The length L1 of each protrusion 142 included in the first upper portion 140S22 protruding from the second side wall 140S2 of the lower electrode 140 may be the same as or different from the other. The distance between each protrusion 142 included in the first upper portion 140S21 in the second direction DR2 and the thickness of each protrusion 142 may be the same as or different from the other.

The length of the first upper portion 140S22 in the second direction DR2 may be shorter than, for example, but is not limited to, the length of the first lower portion 140S21.

The third side wall 140S3 may include a second lower portion 140S31 and a second upper portion 140S32. The second upper portion 140S32 may be disposed above the second lower portion 140S31. The third side wall 140S3 may be flat.

Figure 4:
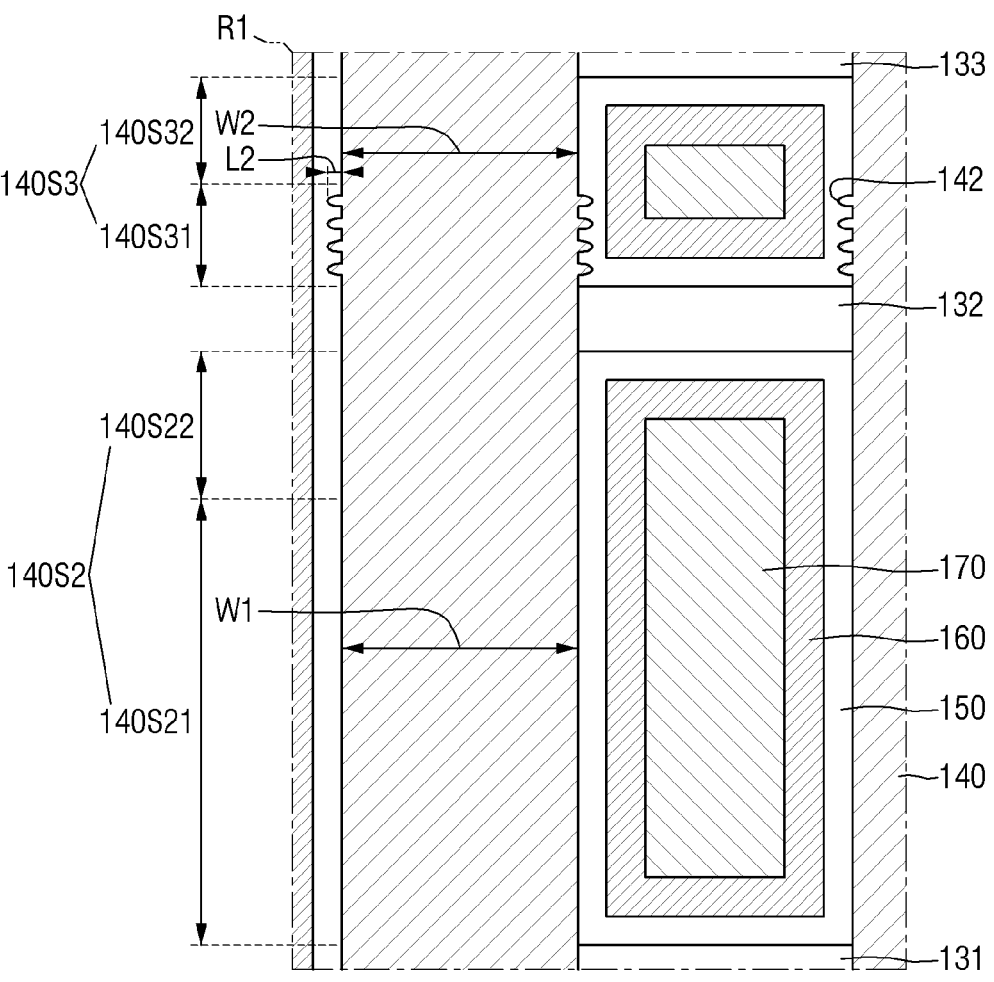

Referring to FIG. 4, in example embodiments, the second lower portion 140S31 may include irregularities. Specifically, the second lower portion 140S31 may include a plurality of protrusions 142 that protrude toward the dielectric film 150 in the first direction DR1.

The length L2 of each protrusion 142 included in the second lower portion 140S31 protruding from the side wall of the lower electrode 140 may be the same as or different from the other. The distance between each protrusion 142 included in the second lower portion 140S31 in the second direction DR2 and the thickness of each protrusion 142 may be the same as or different from the other.

Figure 5:
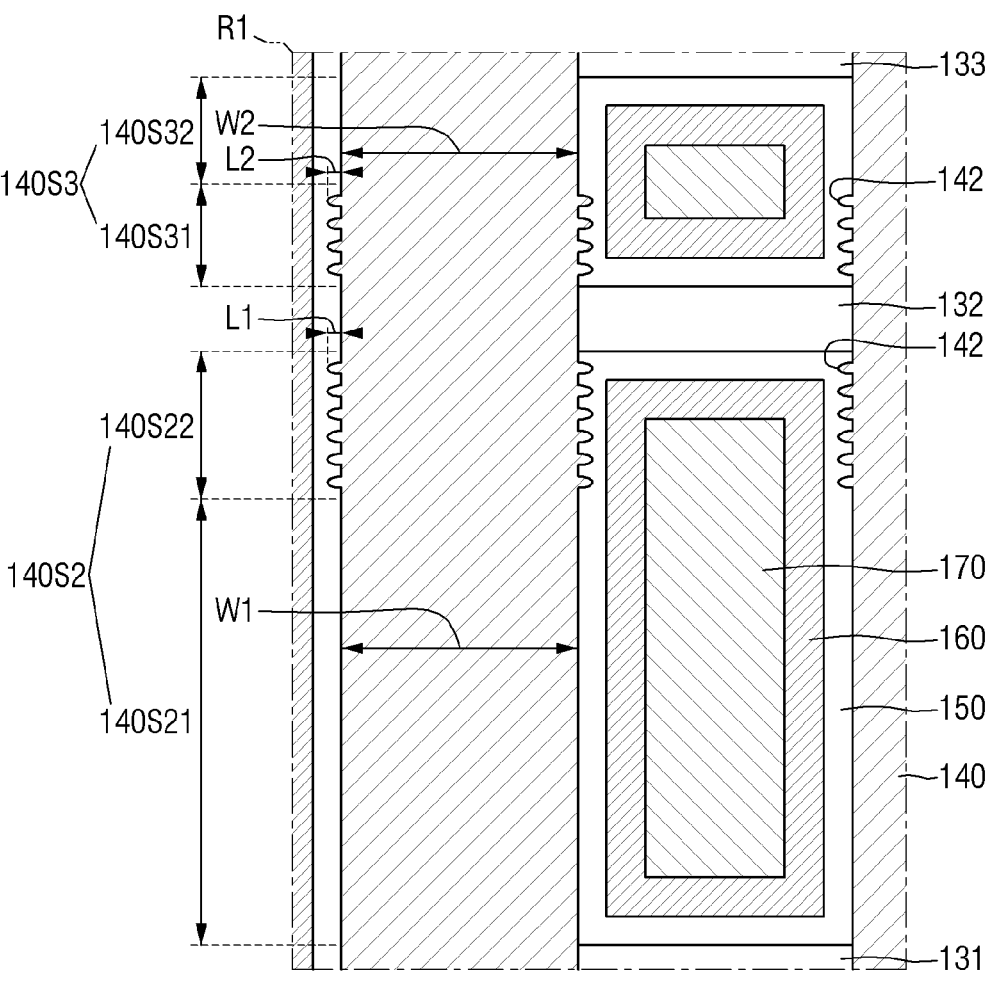

Referring to FIG. 5, in example embodiments, the first upper portion 140S22 and the second lower portion 140S31 may include irregularities. Specifically, the first upper portion 140S22 and the second lower portion 140S31 may include a plurality of protrusions 142 that protrude toward the dielectric film 150 in the first direction DR1.

The length L2 of each protrusion 142 included in the second lower portion 140S31 protruding from the side wall of the lower electrode 140 may be the same as or different from the other. The length L2 of each protrusion 142 included in the second lower portion 140S31 protruding from the side wall of the lower electrode 140 may be the same as or different from the length L1 of each protrusion 142 included in the first upper portion 140S21 protruding from the second side wall 140S2 of the lower electrode 140.

The distance between each protrusion 142 included in the second lower portion 140S31 in the second direction DR2 and the thickness of each protrusion 142 may be the same as or different from the other.

The length of the second upper portion 140S32 in the second direction DR2 may be shorter than, for example, but is not limited to, the length of the second lower portion 140S31. The length of the second upper portion 140S32 in the second direction DR2 may be greater than or the same as the length of the second lower portion 140S31.

Referring to FIG. 1 again, the dielectric film 150 may be disposed on the lower electrode 140. The dielectric film 150 may be formed along the outer surface of the lower electrode 140, the outer surface of the first supporter pattern 131, the outer surface of the second supporter pattern 132, the outer surface of the third supporter pattern 133, and the upper surface of the etching stop film 105. The dielectric film 150 may extend along the profiles of the lower electrode 140, the first supporter pattern 131, the second supporter pattern 132, the third supporter pattern 133, and the etching stop film 105.

In the semiconductor device according to example embodiments, the dielectric film 150 may come into contact with the outer surface of the lower electrode 140, the outer surface of the first supporter pattern 131, the outer surface of the second supporter pattern 132, the outer surface of the third supporter pattern 133, and the upper surface of the etching stop film 105.

Since the first to third supporter patterns 131, 132 and 133 come into contact with the lower electrode 140, the dielectric film 150 does not extend between each of the first to third supporter patterns 131, 132 and 133 and the lower electrode 140. Further, the capacitor dielectric film 150 does not extend between the etching stop film 105 and the lower electrode 140.

The dielectric film 150 may include or may be formed of, for example, but is not limited to, one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. Although the dielectric film 150 is shown as a single film, this is merely for convenience of explanation, and the embodiment is not limited thereto.

The upper electrode 160 may be disposed on the dielectric film 150. The upper electrode 160 may extend along the profile of the dielectric film 150.

The upper plate electrode 170 may be disposed on the upper electrode 160.

The upper electrode 160 and the upper plate electrode 170 may include or may be formed of, for example, but is not limited to, a doped semiconductor material, a conductive metal nitride (e.g., titanium nitride, tantalum nitride or tungsten nitride, etc.), a metal (e.g., ruthenium, iridium, titanium or tantalum, etc.), conductive metal oxides (e.g., iridium oxide) or the like.

Unlike that shown, only one of the upper electrode 160 and the upper plate electrode 170 may be included.

Figure 6:
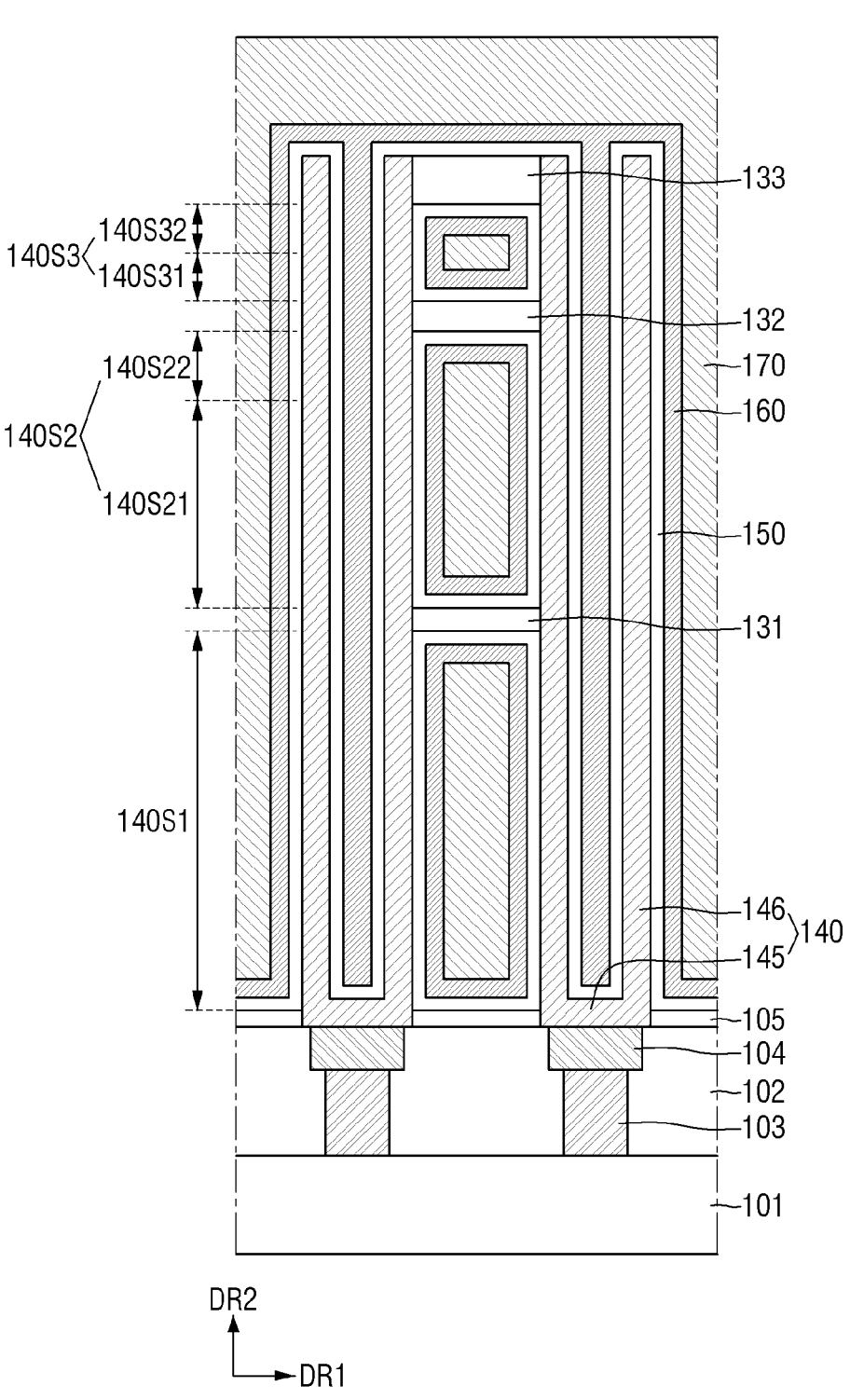
FIG. 6 is a diagram for explaining the semiconductor device according to example embodiments.

FIG. 6 is a diagram for explaining the semiconductor device according to example embodiments. Points different from those described using FIGS. 1 to 5 will be mainly described.

Referring to FIG. 6, in the semiconductor device according to example embodiments, the lower electrode 140 may include a first extension 145 extending along the upper surface of the storage pad 104, and a second extension 146 protruding from the first extension 145. The second extension 146 may extend long from one end of the first extension 145 in the second direction DR2.

The lower electrode 140 may have a tubular-like shape three-dimensionally. The lower electrode 140 may also be described as having, for example, a cylindrical shape.

The upper electrode 160 may fill the space between the side walls of the lower electrode 140 having the cylindrical shape.

Figure 7:
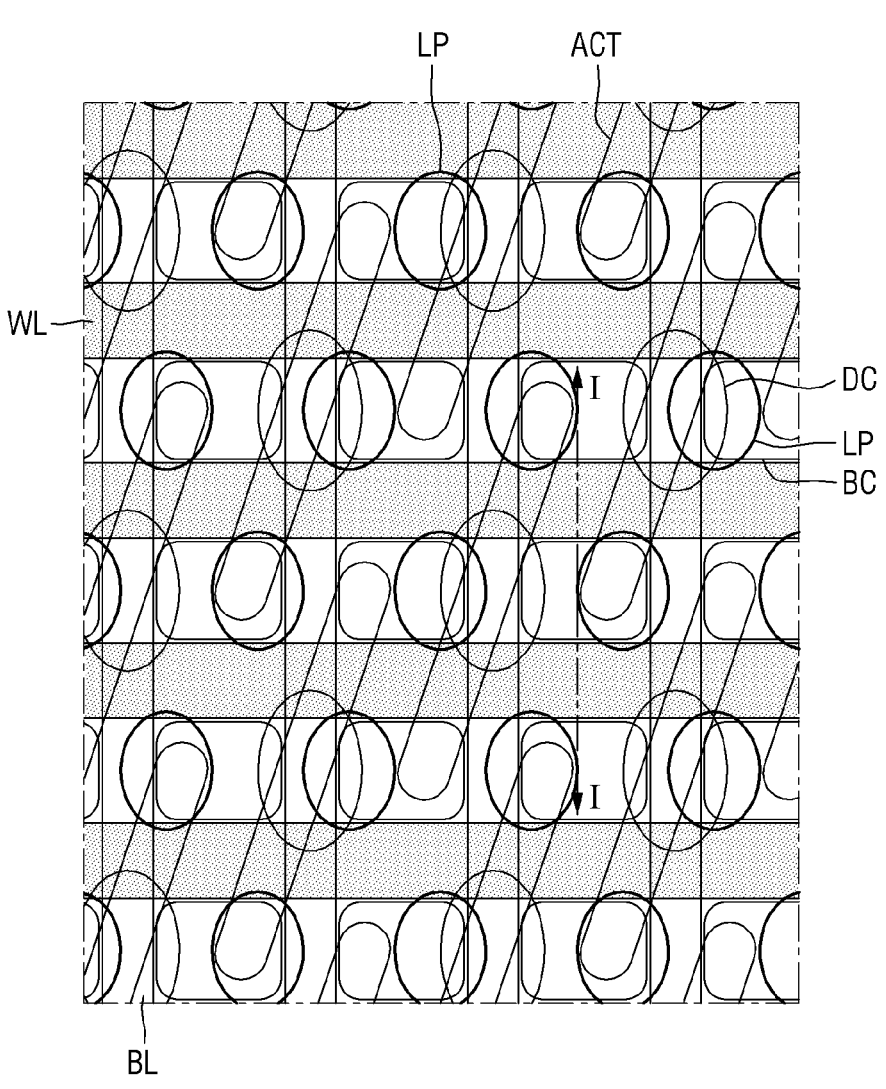
FIG. 7 is a schematic layout diagram for explaining the semiconductor device according to example embodiments.
Figure 7:
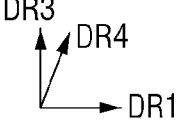
Figure 8:
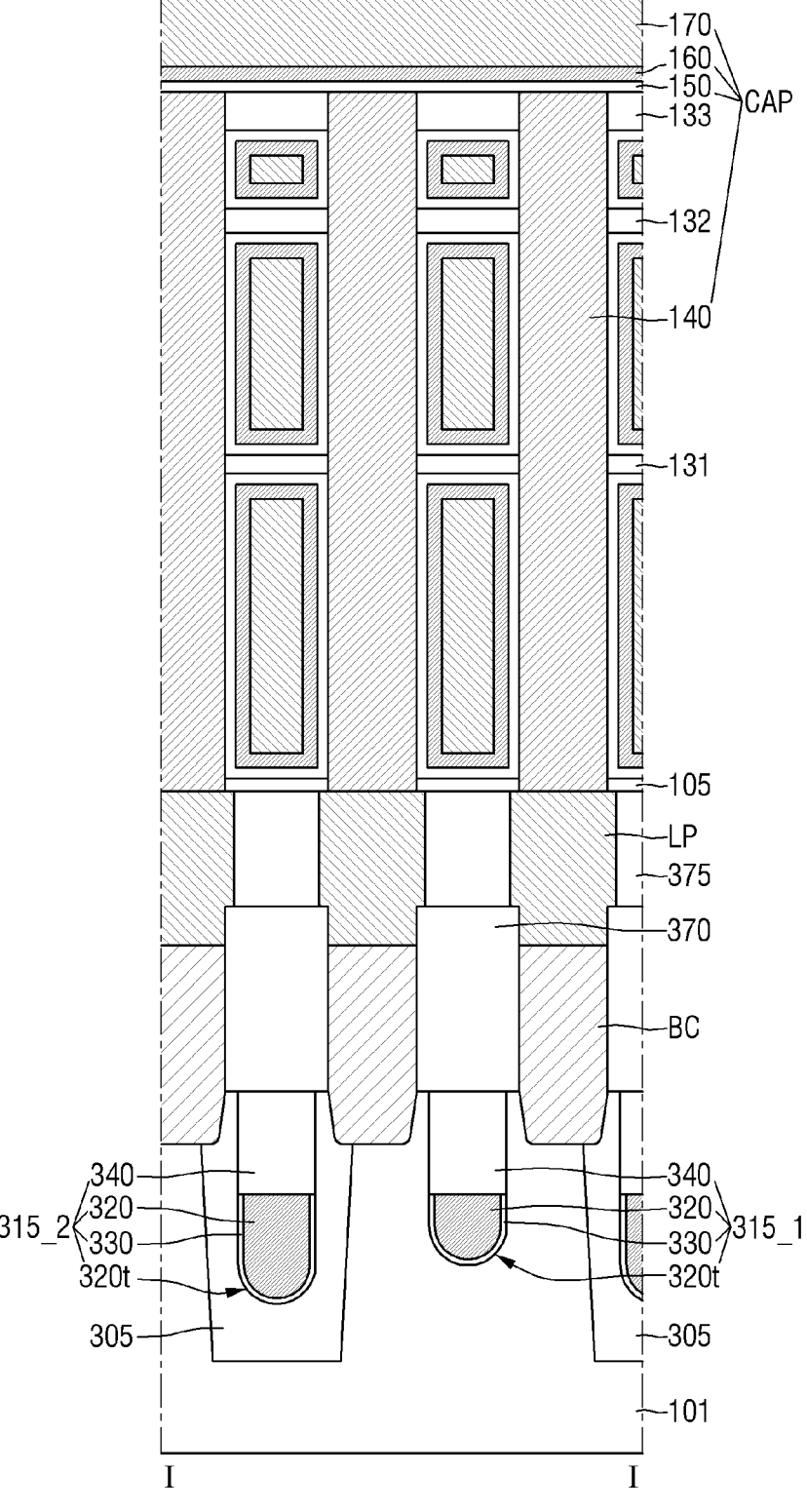
FIG. 8 is a cross-sectional view taken along a line I-I of FIG. 7.

FIG. 7 is a schematic layout diagram for explaining the semiconductor device according to example embodiments. FIG. 8 is a cross-sectional view taken along a line I-I of FIG. 7.

For reference, FIG. 7 shows an exemplary layout diagram of a DRAM (Dynamic Random Access Memory) except a capacitor CAP, but is not limited thereto.

Referring to FIGS. 7 and 8, the semiconductor device according to example embodiments may include a plurality of active regions ACT. The active regions ACT may be defined by an element isolation film 305 formed in the substrate 101 extending in the first direction DR1 and a third direction DR3 perpendicular to the first and second direction. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

With a decrease in design rule of the semiconductor device, the active region ACT may be disposed in the form of bar of a diagonal line or oblique line, as shown. The active region ACT may have the form of a bar extending in a fourth direction DR4.

A plurality of gate electrodes may be disposed on the active region ACT across the active region ACT in the first direction DR1. The plurality of gate electrodes may extend parallel to each other. The plurality of gate electrodes may be, for example, a plurality of word lines WL.

The word lines WL may be disposed at equal intervals. The width of the word lines WL or an interval between the word lines WL may be determined according to the design rules.

A plurality of bit lines BL extending in the third direction DR3 orthogonal to the word line WL may be disposed on the word line WL. A plurality of bit lines BL may extend parallel to each other.

The bit lines BL may be disposed at equal intervals. The width of the bit lines BL or an interval between the bit lines BL may be determined according to the design rules.

The semiconductor device according to example embodiments may include various contact arrangements formed on the active region ACT. Various contact arrangements may include, for example, a direct contact DC, a buried contact BC, a landing pad LP, and the like.

Here, the direct contact DC may mean a contact that electrically connects the active region ACT to the bit line BL. The buried contact BC may mean a contact that connects the active region ACT to the lower electrode 140 of the capacitor CAP. The buried contact BC may correspond to the storage contact 103 of FIGS. 1 to 5.

Due to the arrangement structure, a contact area between the buried contact BC and the active region ACT may be small. Therefore, in order to expand the contact area with the active region ACT and expand the contact area with the lower electrode 140 of the capacitor CAP, a conductive landing pad LP may be introduced. The landing pad LP may correspond to the storage pad 104 of FIGS. 1 to 5.

The landing pad LP may be disposed between the active region ACT and the buried contact BC, or may be disposed between the buried contact BC and the lower electrode 140 of the capacitor CAP. In the semiconductor device according to example embodiments, the landing pad LP may be disposed between the buried contact BC and the lower electrode 140 of the capacitor CAP. By expanding the contact area through the introduction of the landing pad LP, the contact resistance between the active region ACT and the lower electrode 140 of the capacitor CAP may decrease.

In the semiconductor devices according to example embodiments, the direct contact DC may be disposed in a central portion of the active region ACT. The buried contact BC may be disposed at both end portions of the active region ACT.

As the buried contacts BC are disposed at both end portions of the active region ACT, the landing pad LP may be disposed to partially overlap the buried contact BC to be adjacent to both ends of the active region ACT.

Alternatively, the buried contact BC may be formed to overlap the active region ACT and the element isolation film 305 between the adjacent word lines WL and the adjacent bit lines BL.

The word line WL may be formed as a structure buried in the substrate 101. The word line WL may be disposed across the active region ACT between the direct contact DC and the buried contact BC.

As shown, two word lines WL may be disposed across a single active region ACT. Since the active region ACT is disposed diagonally, the word line WL may have an angle of less than 90 degrees with the active region ACT.

The direct contact DC and the buried contact BC may be disposed symmetrically. Therefore, the direct contact DC and the buried contact BC may be disposed on a straight line along the first direction DR1 and the third direction DR3.

On the other hand, unlike the direct contact DC and the buried contact BC, the landing pad LP may be disposed in zigzag in the third direction DR3 along which the bit line BL extends. Further, the landing pad LP may be disposed to overlap the same side surface portion of each bit line BL in the first direction DR1 along which the word line WL extends.

For example, each of the landing pads LP of the first line may overlap the left side surface of the corresponding bit line BL, and each of the landing pads LP of the second line may overlap the right side surface of the corresponding bit line BL.

The semiconductor device according to example embodiments may include gate structures 315_1 and 315_2, a buried contact BC, and a capacitor CAP.

The element isolation film 305 may be formed inside the substrate 101. The element isolation film 305 may have an STI (shallow trench isolation) structure having excellent element isolation characteristics. The element isolation film 305 may define an active region ACT on the substrate 101.

The active region ACT defined by the element isolation film 305 may have a long island shape including a minor axis and a major axis, as shown in the drawings. The active region ACT may have a form of an oblique line to have an angle of less than 90 degrees with respect to the word line WL formed inside the element isolation film 305.

Further, the active region ACT may have an oblique line shape to have an angle of less than 90 degrees with respect to the bit line BL formed on the element isolation film 305. For example, the active region ACT may extend in the fourth direction DR4 having a predetermined angle with respect to the first direction DR1 and the third direction DR3.

Gate structures 315_1 and 315_2 may be formed inside the substrate 101 and the element isolation film 305. The gate structures 315_1 and 315_2 may be formed across the element isolation film 305 and the active region ACT defined by the element isolation film 305.

The gate structures 315_1 and 315_2 include a gate structure 315_1 in the active region ACT of the substrate 101, and a gate structure 315_2 in the element isolation film 305.

The gate structures 315_1 and 315_2 may include a buried gate trench 320t, a gate insulating film 330, a gate electrode 320, and a gate block pattern 340 that are formed inside the substrate 101 and the element isolation film 305. The gate electrode 320 may correspond to the word line WL.

For example, the depth of the buried gate trench 320t formed on the substrate 101 may be different from the depth of the buried gate trench 320t formed on the element isolation film 305.

The gate insulating film 330 may extend along the side wall and the bottom side of the buried gate trench 320t. The gate insulating film 330 may extend along the profile of at least a part of the buried gate trench 320t.

The gate insulating film 330 may include or may be formed of, for example, at least one of silicon oxide, silicon oxynitride, silicon nitride or a high dielectric constant material having a higher dielectric constant than silicon oxide.

The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The gate electrode 320 may be formed on the gate insulating film 330. The gate electrode 320 may fill a part of the buried gate trench 320t.

The gate electrode 320 may include or may be formed of, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), impurity-doped polysilicon, impurity-doped polysilicon germanium, and combinations thereof. The gate electrode 320 may each include a conductive metal oxide, a conductive metal oxynitride, and the like, and may include a form in which the above-mentioned materials are oxidized.

The gate block pattern 340 may be formed on the gate electrode 320. The gate block pattern 340 may fill the remaining buried gate trench 320t in which the gate electrode 320 is formed. The gate block pattern 340 may include or may be formed of, for example, at least one of silicon nitride (SiN), silicon oxynitride (SiON), silicon oxide (SiO₂), silicon carbonitride (SiCN), silicon oxycarbonitride (SiOCN), and combinations thereof.

The lower interlayer insulating film 370 may be disposed on the substrate 101 and the element isolation film 305. The lower interlayer insulating film 370 may cover the gate structures 315_1 and 315_2.

The buried contact BC may be formed inside the lower interlayer insulating film 370. The buried contact BC may be connected to the substrate 101. More specifically, the buried contact BC may be connected to a source/drain region formed in the active region ACT of the substrate 101.

The buried contact BC may be located on at least one side of the gate structures 315_1 and 315_2. For example, the buried contact BC may be disposed on both sides of the gate structures 315_1 and 315_2.

The landing pad LP may be formed on the buried contact BC. The landing pad LP may be electrically connected to the buried contact BC.

An upper interlayer insulating film 375 may be formed on the lower interlayer insulating film 370. The upper interlayer insulating film 375 may wrap the landing pad LP. The upper interlayer insulating film 375 and the lower interlayer insulating film 370 may correspond to the interlayer insulating film 102 of FIGS. 1 to 13.

The etching stop film 105 may be formed on the upper interlayer insulating film 375 and the landing pad LP.

The capacitor CAP may be disposed on the landing pad LP. The capacitor CAP may be connected to the landing pad LP. For example, the capacitor CAP may be electrically connected to the buried contact BC.

The capacitor CAP may include a lower electrode 140, a dielectric film 150, an upper electrode 160, and an upper plate electrode 170. The first supporter pattern 131, the second supporter pattern 132, and the third supporter pattern 133 may be formed on the etching stop film 105.

The description of the lower electrode 140, the capacitor dielectric film 150, the upper electrode 160, and the upper plate electrode 170 included in the capacitor CAP may be substantially the same as those described using FIGS. 1 to 5.

Figure 9A:
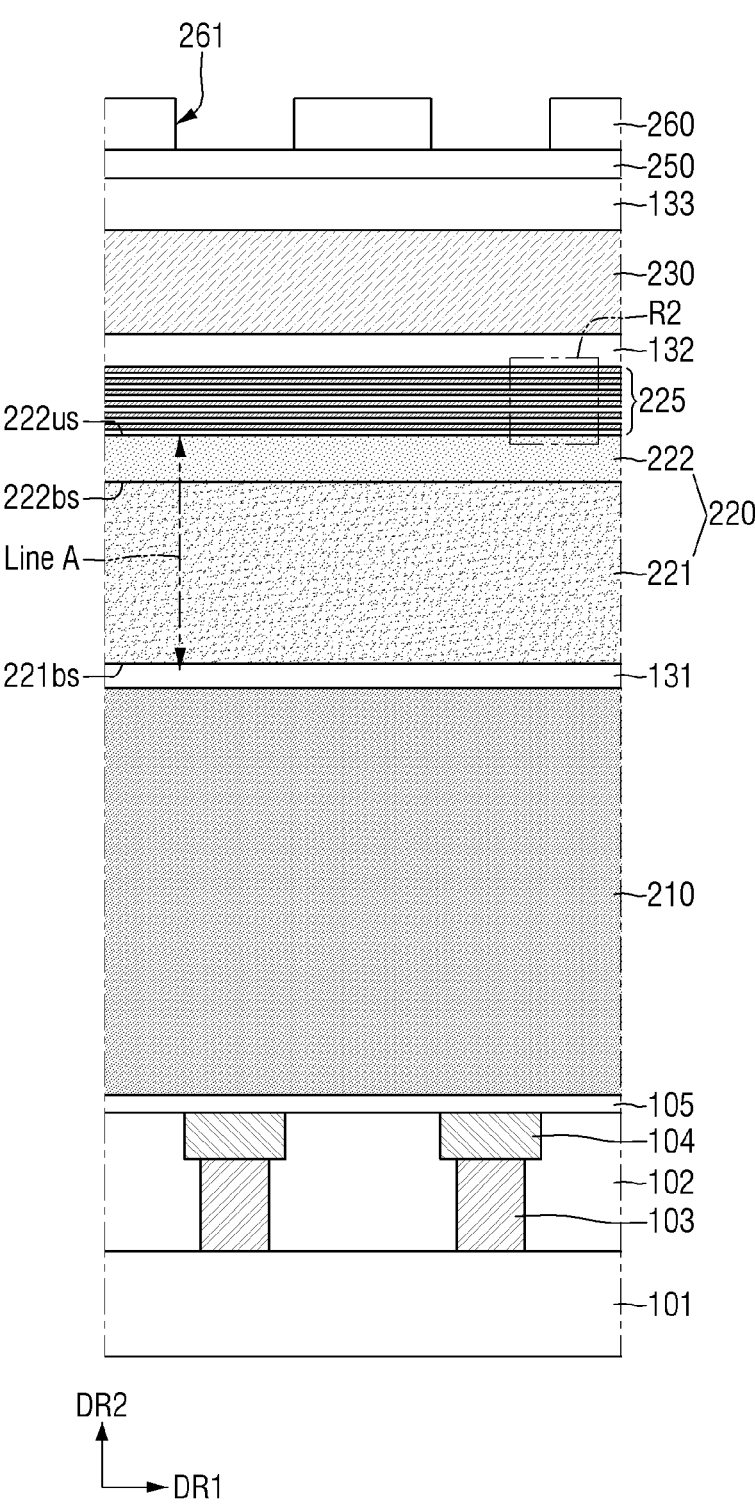
FIGS. 9A, 9B, 10-14, 15A, 15B, 16, and 17 are intermediate stage diagrams for explaining a method for fabricating a semiconductor device according to example embodiments.
Figure 9B:
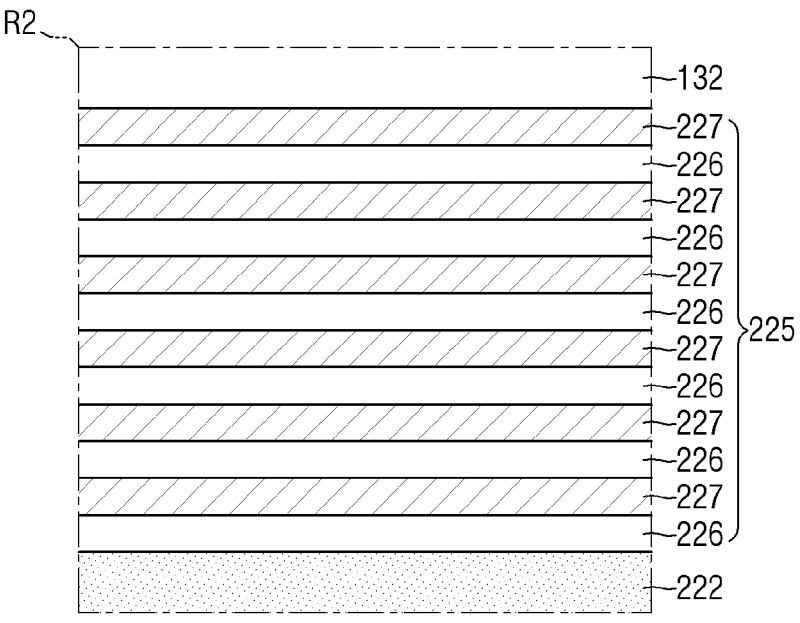
Figure 10:
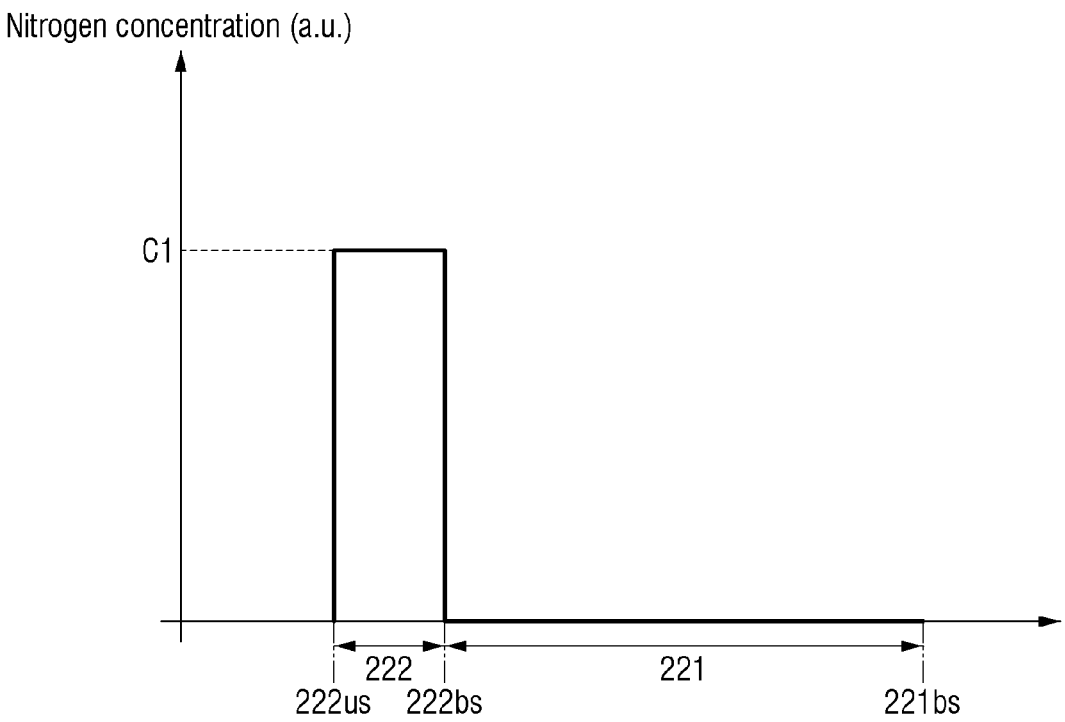
Figure 11:
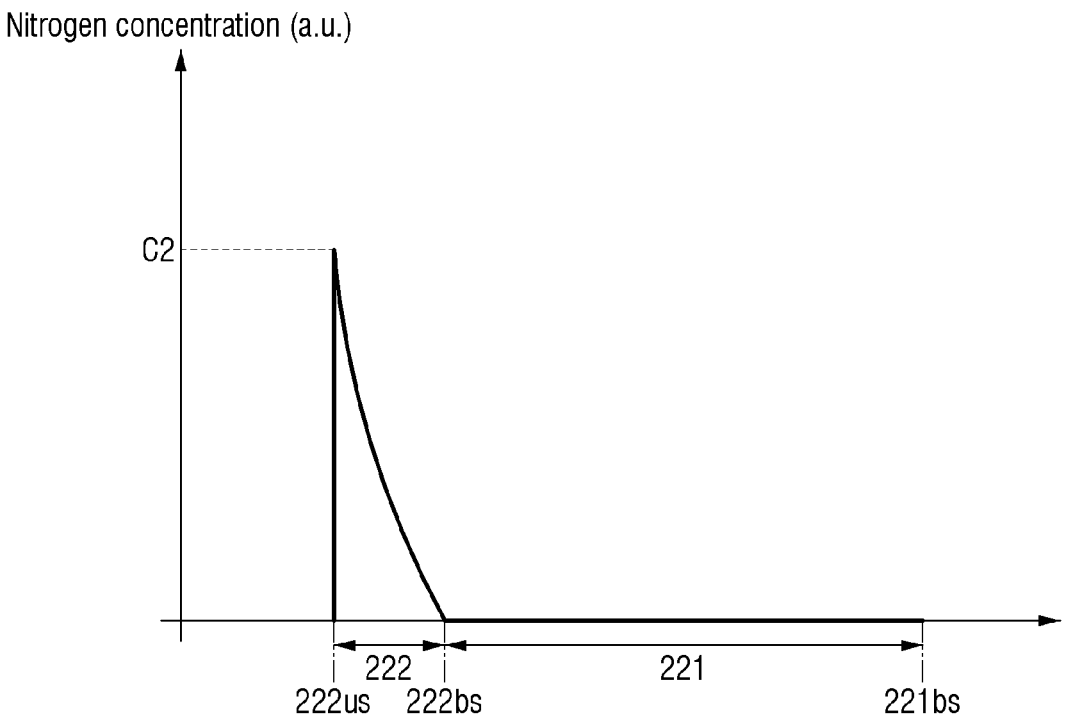
Figure 12:
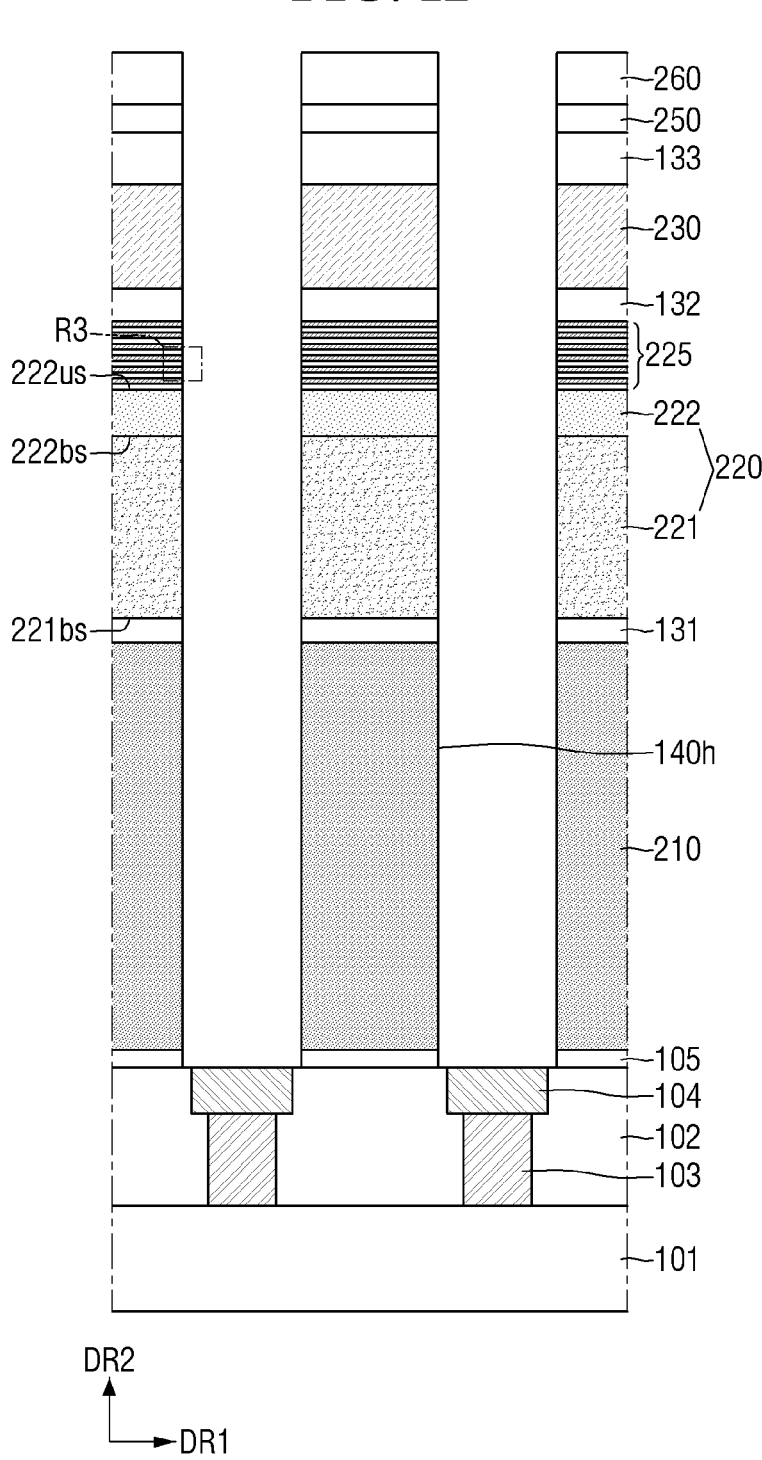
Figure 13:
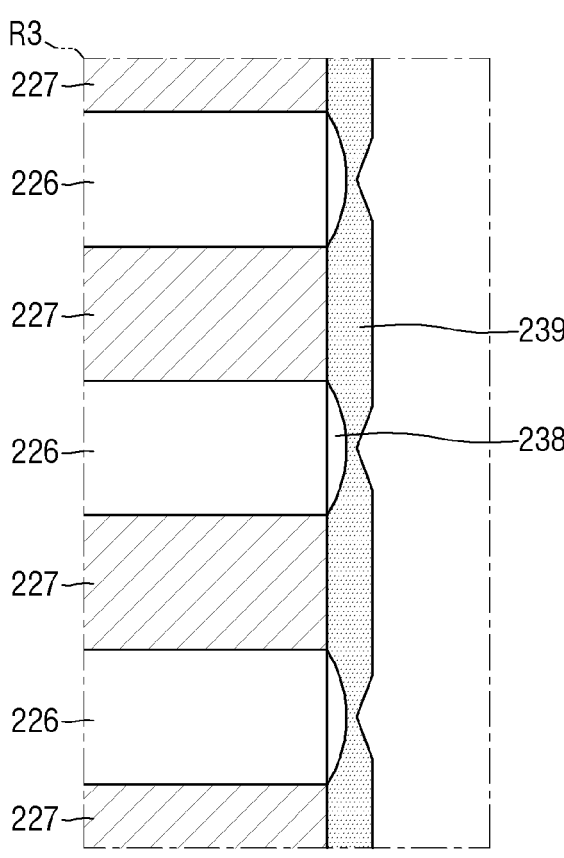
Figure 14:
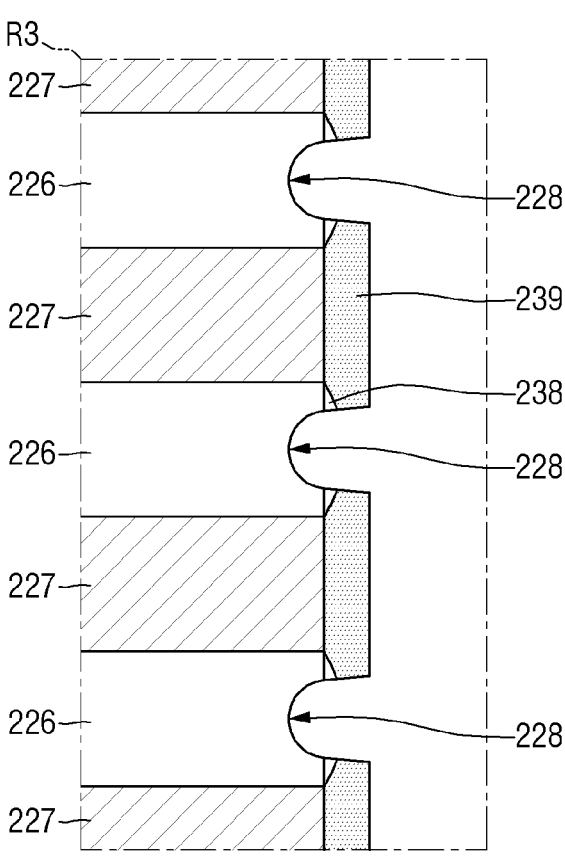
Figure 15A:
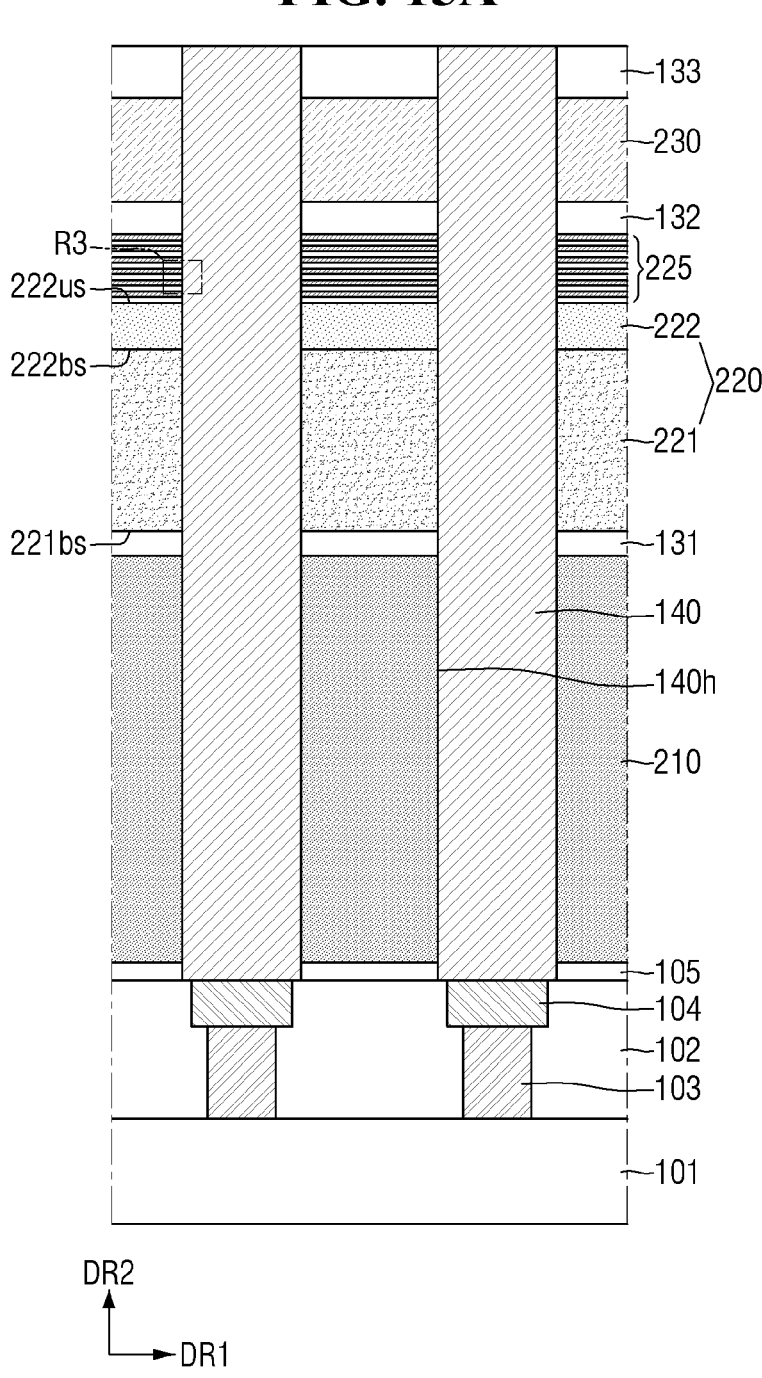
Figure 15B:
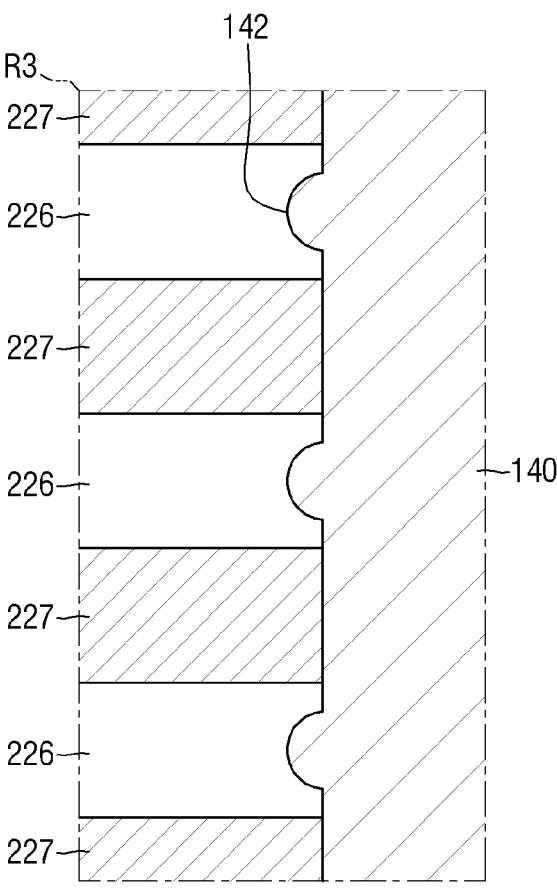

FIGS. 9A, 9B, 10-14, 15A, 15B, 16, and 17 are intermediate stage diagrams for explaining a method for fabricating a semiconductor device according to example embodiments. FIG. 9B is an enlarged view of a region R2 of FIG. 9A. FIGS. 10 and 11 are schematic graphs showing the concentration of nitrogen (N) along a line A of FIG. 9A. FIGS. 13 and 14 are enlarged views of a region R3 of FIG. 12. FIG. 15B is an enlarged view of FIG. 15A.

Referring to FIGS. 9A and 9B, the storage contact 103 and the storage pad 104 may be formed inside the interlayer insulating film 102 on the substrate 101.

An etching stop film 105, a first mold layer 210, a first supporter pattern 131, a second mold layer 220, a first buffer structure 225, a second supporter pattern 132, a third mold layer 230, a third supporter pattern 133, a first mask film 250, and a second mask film 260 may be sequentially formed on the interlayer insulating film 102.

The first mold layer 210 may include or may be formed of, for example, silicon oxide. The first supporter pattern 131 may include a material having etching selectivity with respect to the first mold layer 210. The first supporter pattern 131 may include or may be formed of, for example, silicon nitride.

The second mold layer 220 may include a material having etching selectivity with respect to the first supporter pattern 131. The second mold layer 220 may include or may be formed of, for example, silicon oxide.

A part of the second mold layer 220 may include nitrogen (N). The second mold layer 220 may include a first film 221 including no nitrogen, and a second film 222 including nitrogen. For example, in the second mold layer 220, a region including no nitrogen may be defined as the first film 221, and a region including nitrogen may be defined as the second film 222. The second film 222 may be disposed on the first film 221.

Referring to FIGS. 9A and 10, the concentration of doped nitrogen in the second film 222 may be equal to the constant C1. The concentration of doped nitrogen in the second film 222 may be constant from the upper surface 222us of the second film 222 to the lower surface 222bs of the second film 222. The lower surface 222bs of the second film 222 may be the upper surface of the first film 221.

In FIG. 10, the concentration of nitrogen only indicates the magnitude of the concentration for each region, but does not indicate a quantified concentration value.

Referring to FIGS. 9A and 11, the concentration of doped nitrogen in the second film 222 on the upper surface 222us of the second film 222 may be the highest as C2. The concentration of doped nitrogen in the second film 222 may decrease from the upper surface 222us of the second film 222 to the lower surface 222bs of the second film 222.

Although FIG. 11 shows that the concentration of doped nitrogen in the second film 222 is the highest on the upper surface 222us of the second film 222, the concentration is not limited thereto. The portion in which the concentration of doped nitrogen in the second film 222 is the highest may be a region having an arbitrary thickness on the upper surface 222us of the second film 222.

Referring to FIGS. 9A and 9B again, the first buffer structure 225 may be formed on the second mold layer 220. The first buffer structure 225 may include a plurality of first buffer films 226 and a plurality of second buffer films 227 that are stacked alternately in the second direction DR2.

In the second direction DR2, the thickness of the first buffer film 226 and the thickness of the second buffer film 227 may be the same as or different from each other. In the second direction DR2, the thickness of any one of the first buffer films 226 may be different from or the same as the thickness of the other first buffer films 226. In the second direction DR2, the thickness of any one of each of the second buffer films 227 may be different from or the same as the thickness of the other second buffer films 227.

The first buffer film 226 and the second buffer film 227 may include materials different from each other. For example, the first buffer film 226 may include or may be formed of silicon oxide, and the second buffer film 227 may include or may be formed of silicon nitride.

The second supporter pattern 132 may be formed on the first buffer structure 225. The second supporter pattern 132 may include a material having etching selectivity with respect to the first buffer structure 225. The second supporter pattern 132 may include or may be formed of, for example, a silicon carbide nitride film (SiCN).

The third mold layer 230 may be formed on the second supporter pattern 132. The third mold layer 230 may include a material having an etching selectivity with respect to the second supporter pattern 132. The third mold layer 230 may include or may be formed of, for example, silicon nitride.

The third supporter pattern 133 may be formed on the third mold layer 230. The third supporter pattern 133 may include or may be formed of, for example, silicon nitride.

The first mask film 250 may be formed on the third supporter pattern 133. The first mask film 250 may include or may be formed of, for example, silicon nitride. The second mask film 260 may be formed on the first mask film 250. The second mask film 260 may include an opening 261 that exposes at least a part of the first mask film 250. The second mask film 260 may include or may be formed of, for example, polysilicon.

Referring to FIG. 12, a lower electrode hole 140h that penetrates the first mask film 250, the third supporter pattern 133, the third mold layer 230, the second supporter pattern 132, the first buffer structure 225, the second mold layer 220, the first supporter pattern 131, the first mold layer 210, and the etching stop film 105 may be formed by utilizing the second mask film 260 as an etching mask. The lower electrode hole 140h may be formed, for example, through a dry etching process. The etching gas used in the dry etching process may be, for example, $F_4$, $CF_4/O_2$ or $C_2F_6/O_2$.

The first and second mask films 250 and 260 may be removed, for example, through the etching process. Alternatively, the first and second mask films 250 and 260 may be removed, for example, through a separate etching process after the etching process for forming the lower electrode hole 140h is completed.

Referring to FIGS. 12 to 14, etching by-products 238 and 239 may be formed on the side walls of the first buffer structure 225 in the process of forming the lower electrode hole 140h using the etching gas.

The first buffer film 226 and the etching gas may be combined to form a first etching by-product 238, and the second buffer film 227 and the etching gas may be combined to form a second etching by-product 239. For example, the first etching by-product 238 may be formed by combining silicon oxide with the etching gas. The second etching by-product 239 is formed by combining silicon nitride with the etching gas, and at this time, oxygen (O) of the second buffer film 227 and carbon (C) of the etching gas may be combined to generate carbon monoxide (CO) or carbon dioxide ($CO_2$). As discussed above, the third supporter pattern 133, the third mold layer 230, and the second supporter pattern 132, stacked on the first buffer structure 225, in addition to the second buffer film 227 may all include or may be formed of silicon nitride. As a result, during the formation of the lower electrode hole 140h, there is a greater amount of silicon nitride than silicon oxide for the etching gas to combine with. Therefore, the thickness of the second etching by-product 239 formed on the second buffer film 227 may be thicker than the thickness of the first etching by-product 238 formed on the first buffer film 226.

The second etching by-product 239 may be diffused to the side walls of the first buffer films 226 adjacent to each other in the second direction DR2. The first etching by-product 238 and the second etching by-product 239 may be formed on the side walls of the first buffer film 226. Accordingly, the side walls of the first buffer film 226 exposed by the lower electrode hole 140h may be protected by the first and second etching by-products 238 and 239 during the etching process, and the second buffer film 227 may be protected by the second by-product 239.

Referring to FIG. 13, in example embodiments, the side walls of the first buffer film 226 and the side walls of the second buffer film 227 may not be etched. The side walls of the first buffer film 226 and the side walls of the second buffer film 227 may be flat.

Referring to FIG. 14, in example embodiments, at least a part of the side walls of the first buffer film 226 may be etched. Therefore, the side walls of the first buffer film 226 may include a portion 228 that is recessed into the first buffer film 226.

During the etching process, the side walls of the first and the second buffer films 226 and 227 may be protected by the first and second etching by-products 238 and 239. Therefore, the side walls of the first and the second buffer films 226 and 227 have no portion 228 as shown in FIG. 12A, or when the portion 228 are formed on the side walls of the first and the second buffer films 226 and 227, the portion 228 has reduced and/or minimum sizes as shown in FIG. 12B.

The first and second etching by-products 238 and 239 may be removed by an ashing and/or strip process.

Referring to FIGS. 15A and 15B, the lower electrode 140 may be formed inside the lower electrode hole 140*h*. The lower electrode 140 may fill the lower electrode hole 140*h*. The lower electrode 140 may be formed by a flattening process, after filling the lower electrode hole 140*h* and forming a lower electrode film that covers the third supporter pattern 133. The lower electrode 140 may be formed, for example, through a chemical vapor deposition (CVD) or an atomic layer deposition (ALD) process.

The lower electrode 140 may fill the inside of a recessed portion 228 of FIG. 14. Therefore, the side walls of the lower electrode 140 may include a plurality of protrusions 142 that protrude from the side walls of the lower electrode 140.

Figure 16:
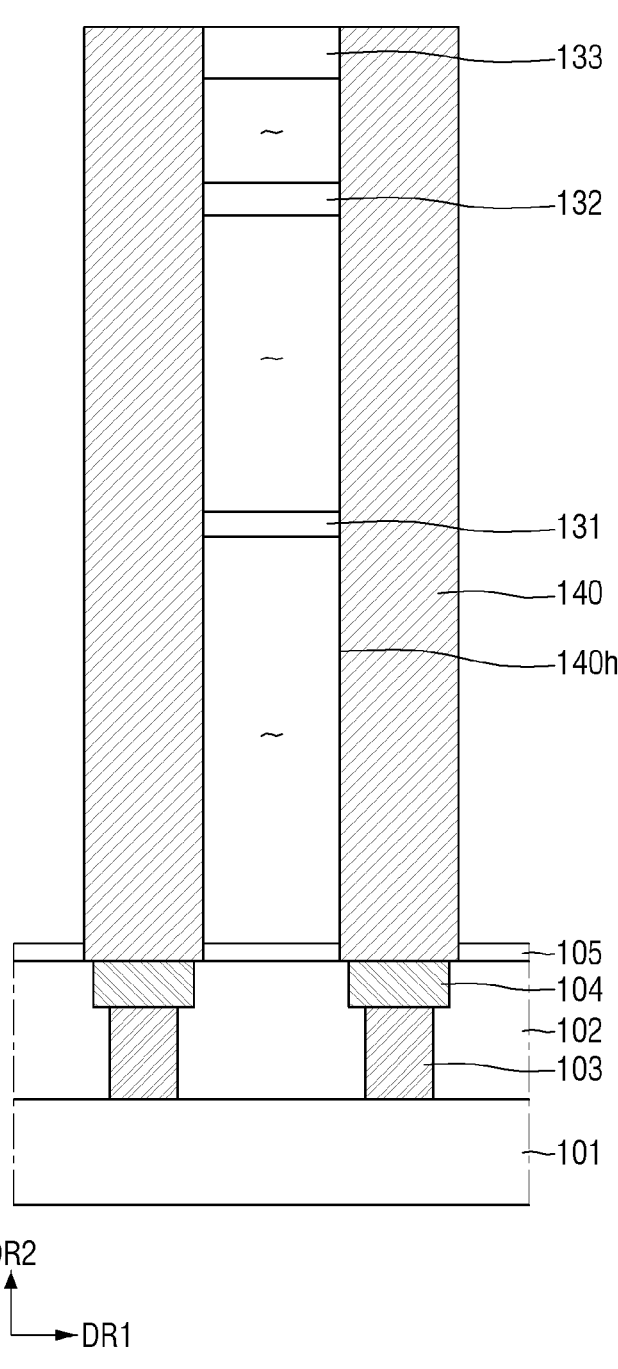

Referring to FIG. 16, the first to third mold layers 210, 220 and 230 and the first buffer structure 225 may be removed through a wet etching process that uses an etching solution having etching selectivity to the first to third supporter patterns 131, 132 and 133. For example, the etching solution may be removed, using hydrofluoric acid (HF) or LAL (Limulus amoebocyte lysate).

In the process of removing the first to third mold layers 210, 220 and 230 and the first buffer structure 225, a part (e.g., near the top and bottom surfaces) of the first to third supporter patterns 131, 132 and 133 may be removed. Therefore, the first to third supporter patterns 131, 132 and 133 may connect the adjacent lower electrodes 140. Each of the first to third supporter patterns 131, 132 and 133 may come into contact with a part of the side walls of the lower electrode 140.

Accordingly, a space may be formed between the etching stop film 105 and the first supporter pattern 131, between first supporter pattern 131 and the second supporter pattern 132, and between the second supporter pattern 132 and the third supporter pattern 133.

Figure 17:
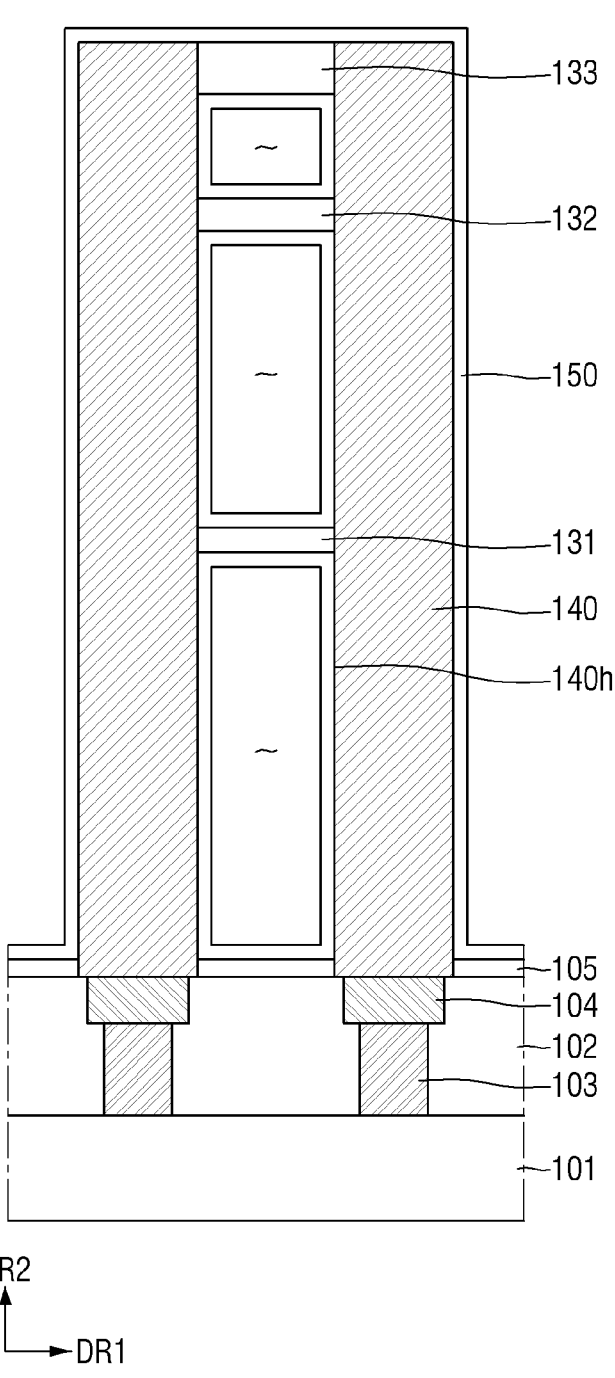

Referring to FIG. 17, the dielectric film 150 may be formed on the lower electrode 140.

The dielectric film 150 may be formed along the surface of the lower electrode 140, the surfaces of the first to third supporter patterns 131, 132 and 133, and the upper surface of the etching stop film 105. The dielectric film 150 may be formed along the profiles of the lower electrode 140, the first to third supporter patterns 131, 132 and 133, and the etching stop film 105.

Referring to FIGS. 1 to 3, the upper electrode 160 may be formed on the dielectric film 150. The upper electrode 160 may be formed along the profile of the dielectric film 150.

The upper plate electrode 170 may be formed on the upper electrode 160. The upper plate electrode 170 may cover the upper electrode 160.

As the semiconductor devices become highly integrated, the aspect ratio of the lower electrode increases. As the aspect ratio of the lower electrode increases, a phenomenon in which the capacitor warps may occur. To prevent this problem, the semiconductor device may include three supporter patterns 131, 132 and 133.

As the aspect ratio of the lower electrode increases, the lower electrode hole 140*h* may be formed, using ions having high energy through a dry etching process, such as plasma etching (e.g., reactive ion etching plasma ashing, and ion milling). At this time, the side walls of the mold layer are etched by ion scattering or the like, and a portion that is recessed into the mold layer may be formed. A length of the recessed portion may vary, depending on the speed of ions, an incident angle of ions, an amount of etching by-products formed on the side walls of the mold layer, and the like. The formation of the recessed portion may be referred to as a "bowing." Bowing is a critical dimension loss under the mask level caused by a distortion in the ion trajectory (e.g., ion scattering). For example, bowing produces concave lateral surfaces (i.e., "recessed portion(s)") in the mold layer and may result in an etch profile that becomes barrel-shaped. Accordingly, as a result of bowing, the etched hole does not have a consistent diameter or width throughout the entire depth of the hole.

Bowing may cause defects in vapor deposition of the upper electrode 160 and reduce the thickness of the upper electrode 160. Further, the vapor deposition of the dielectric film 150 may be defective, and a bridge may be generated between the lower electrodes 140.

As described above, in the process of forming the lower electrode hole 140*h*, silicon nitride may form more etching by-products than silicon oxide. Since silicon oxide is not sufficiently protected by the etching by-products, there is high likelihood that bowing may occur in a mold layer formed of or including silicon oxide as compared to a mold layer formed of or including silicon nitride. On the other hand, since the difficulty of the etching process of silicon nitride is higher than that of silicon oxide, there is a difficulty in forming all the mold layers to include silicon nitride.

The semiconductor device according to example embodiments may prevent the warpage phenomenon of the capacitor CAP, by including the three supporter patterns 131, 132 and 133.

In the method for fabricating a semiconductor device according to example embodiments, the third mold layer 230 may include silicon nitride. Therefore, in the process of forming the lower electrode hole 140*h*, the recessed portion (bowing) may not be formed on the side walls of the third mold layer 230.

In the method for fabricating the semiconductor device according to example embodiments, the first buffer structure 225 may be formed below the second supporter pattern 132. Therefore, the recessed portion (bowing) may not be formed on the side walls of the first buffer structure 225 in the process of forming the lower electrode hole 140*h*. As shown in FIG. 14, the partially recessed portion 228 may be formed in the first buffer film 226. However, because the first buffer film 226 is protected by the first and second etching by-products 238 and 239, the length of the recessed portion 228 may be shorter than a case where only the first buffer film 226 is present without the buffer film 227.

The number and thickness of the first buffer film 226 and the second buffer film 227 may be determined depending on the height at which the first buffer film 226 and the second buffer film 227 are formed, the amount of the first and second etching by-products 238 and 239 formed on the first buffer film 226 and the second buffer film 227, and the like.

Even if the third mold layer 230 and the first buffer structure 225 are present, as the aspect ratio of the lower electrode 140 increases, the recessed portion (bowing) may also be formed in the second mold layer 220. However, in the method for fabricating a semiconductor device according to example embodiments, the second mold layer 220 may include a second film 222 including nitrogen in the upper part. This makes it possible to prevent the recessed portion (bowing) from being formed on the second film 222.

Further, a part of momentum (e.g., energy) of ions may be absorbed by the etching by-products formed on the third mold layer 230, the first buffer structure 225 and the second film 222. Therefore, it is possible to prevent the recessed portion from being formed on the first film 221.

On the other hand, although the first mold layer 210 includes silicon oxide, because the momentum of ions is absorbed by the etching by-products formed on the second mold layer 220, the first buffer structure 225 and the third mold layer 230, it is possible to prevent the recessed portion (bowing) from being formed on the side walls of the first mold layer 210.

Therefore, even if the semiconductor device includes the three supporter patterns 131, 132 and 133, the side walls of the lower electrode 140 may be flat. Therefore, the reliability of the semiconductor device may be improved.

The thickness of the second film 222 or the concentration of nitrogen in the second film 222 may be determined, depending on the height at which the second film 222 is formed, the amount of etching by-products formed on the second film 222, the momentum of ions absorbed by the first buffer structure 225, and the like. Referring to FIG. 10, C1 which is the concentration of doped nitrogen in the second film 222, and the thickness of the second film 222 in the second direction DR2 may be determined, depending on the height at which the second film 222 is formed, the amount of etching by-products formed on the second film 222, the momentum of ions absorbed by the first buffer structure 225, and the like. Referring to FIG. 11, C2 which is the maximum concentration of doped nitrogen in the second film 222 and the thickness of the second film 222 in the second direction DR2 may be determined, depending on the height at which the second film 222 is formed, the amount of etching by-products formed on the second film 222, the momentum of ions absorbed by the first buffer structure 225, and the like.

Figure 18:
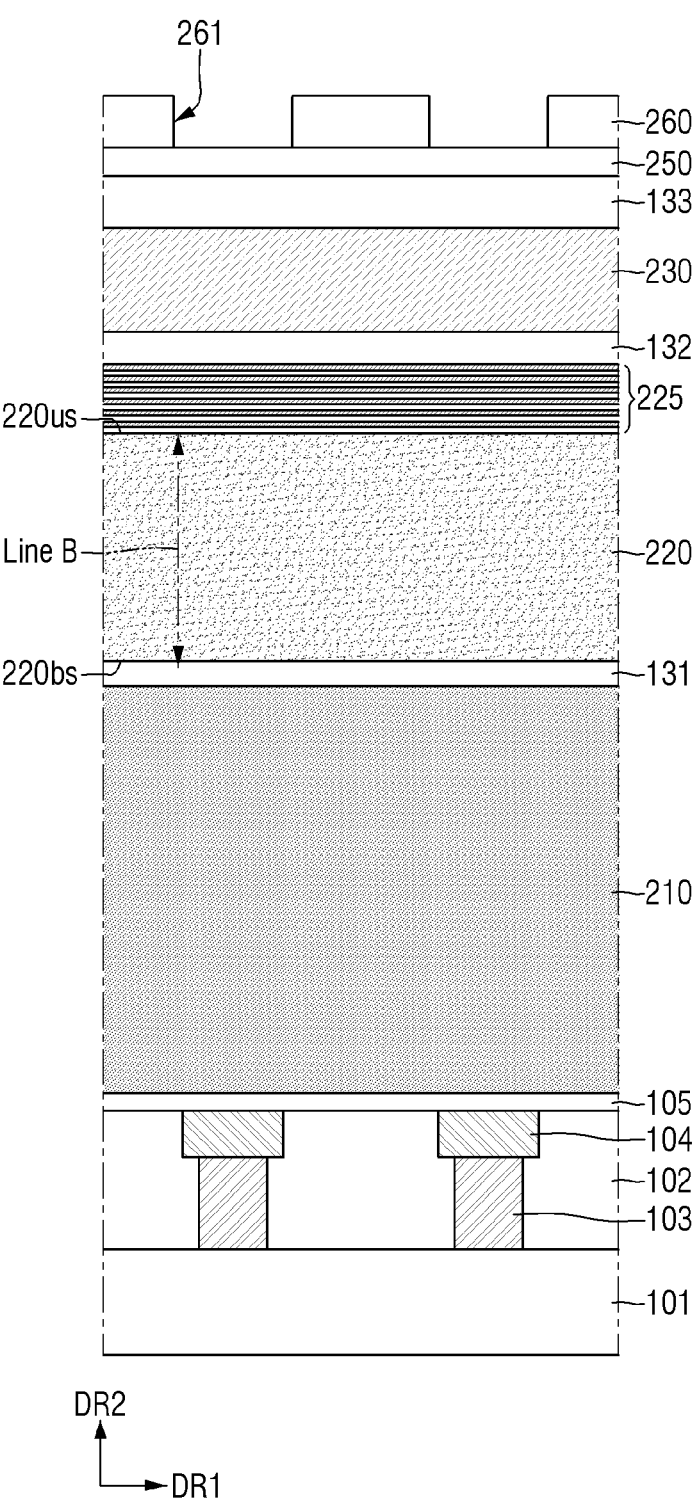
FIG. 18 is an intermediate process diagram for explaining the method for fabricating the semiconductor device according to example embodiments.
Figure 19:
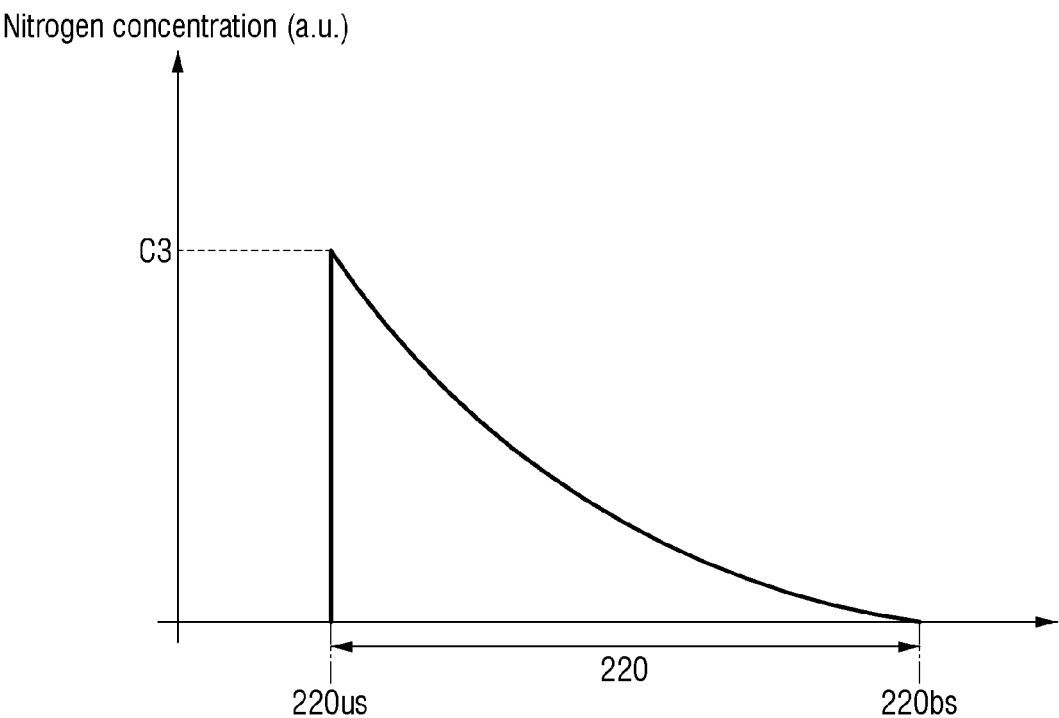
FIG. 19 is a schematic graph showing a concentration of nitrogen (N) along a line B of FIG. 18.

FIG. 18 is an intermediate process diagram for explaining the method for fabricating the semiconductor device according to example embodiments. FIG. 19 is a schematic graph showing the concentration of nitrogen (N) along a line B of FIG. 18. Points different from those described using FIGS. 9 to 17 will be mainly described.

Referring to FIG. 18, in a method for fabricating a semiconductor device according to example embodiments, the second mold layer 220 may be disposed between the first supporter pattern 131 and the first buffer structure 225. The second mold layer 220 may include nitrogen.

Referring to FIG. 19, the concentration of doped nitrogen in the second mold layer 220 on the upper surface 220us of the second mold layer 220 may be the highest as C3. The concentration of doped nitrogen in the second mold layer 220 may decrease from the upper surface 220us of the second mold layer 220 to the lower surface 220bs of the second mold layer 220.

Although FIG. 19 shows that the concentration of doped nitrogen in the second mold layer 220 is the maximum on the upper surface 220us of the second mold layer 220, the concentration is not limited thereto. The portion in which the concentration of doped nitrogen in the second mold layer 220 is the highest may be a region having an arbitrary thickness on the upper surface 220us of the second mold layer 220.

Figure 20A:
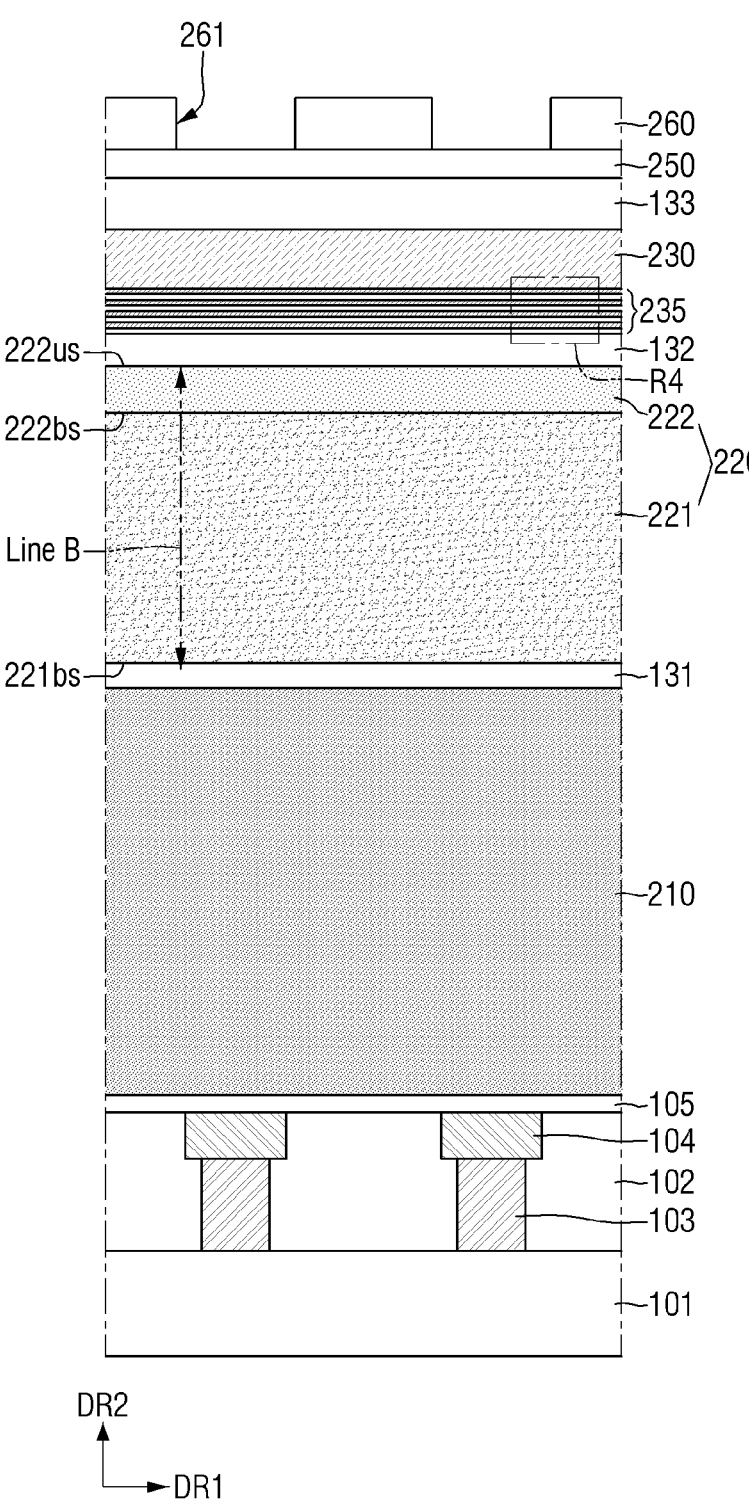
FIG. 20A is an intermediate stage diagram for explaining the method for fabricating the semiconductor device according to example embodiments.
Figure 20B:
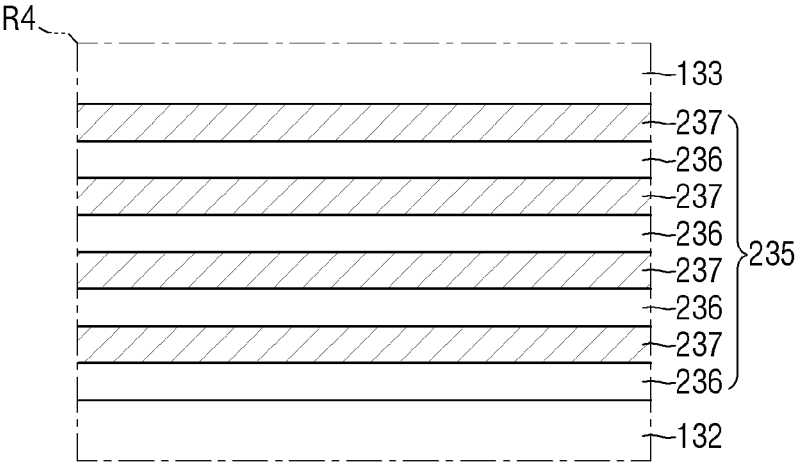
FIG. 20B is an enlarged view of a region R4 of FIG. 20A.

FIG. 20A is an intermediate stage diagram for explaining the method for fabricating the semiconductor device according to example embodiments. FIG. 20B is an enlarged view of a region R4 of FIG. 20A. Points different from those described using FIGS. 9 to 17 will be mainly described.

Referring to FIG. 20A, in the method for fabricating a semiconductor device according to example embodiments, the etching stop film 105, the first mold layer 210, the first supporter pattern 131, the second mold layer 220, the second supporter pattern 132, the second buffer structure 235, the third mold layer 230, the third supporter pattern 133, the first mask film 250, and the second mask film 260 may be formed sequentially on the interlayer insulating film 102.

The second mold layer 220 may include a first film 221 including no nitrogen, and a second film 222 including nitrogen. FIGS. 10 and 11 may be schematic graphs showing the concentration of nitrogen along a line B of FIG. 20A.

Alternatively, unlike that shown, the second mold layer 220 of FIG. 20A may be the second mold layer 220 of FIGS. 18 and 19.

Referring to FIGS. 20A and 20B, the second buffer structure 235 may be formed on the second supporter pattern 132. The second buffer structure 235 may include a plurality of third buffer films 236 and a plurality of fourth buffer films 237 that are alternately stacked in the second direction DR2.

In the second direction DR2, the thickness of the third buffer film 236 and the thickness of the fourth buffer film 237 may be equal to or different from each other. In the second direction DR2, the thickness of any one of the third buffer films 236 may be different from or the same as the thickness of the other third buffer films 236. In the second direction DR2, the thickness of any one of the fourth buffer films 237 may be different from or the same as the thickness of the other fourth buffer films 237.

The third buffer film 236 and the fourth buffer film 237 may include materials different from each other. For example, the third buffer film 236 may include silicon oxide, and the fourth buffer film 237 may include silicon nitride. The description of the third buffer film 236 and the fourth buffer film 237 may be substantially the same as the description of the first buffer film 226 and the second buffer film 227 described using FIGS. 9 to 17.

The semiconductor devices of FIGS. 1 and 4 may be formed by the fabricating method described using FIGS. 12 to 17.

Figure 21:
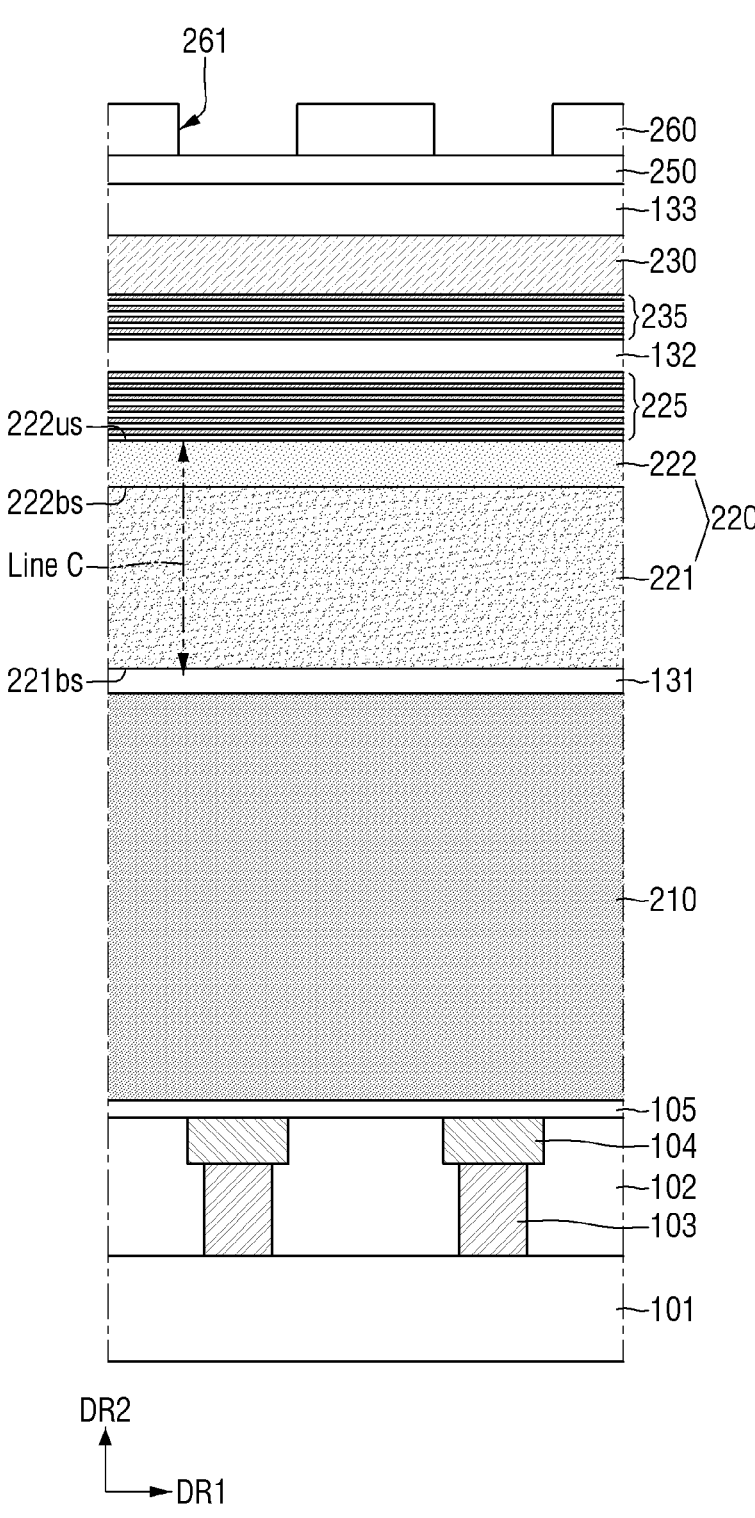
FIG. 21 is an intermediate process diagram for explaining the method for fabricating the semiconductor device according to example embodiments.

FIG. 21 is an intermediate stage diagram for explaining the method for fabricating the semiconductor device according to example embodiments. Points different from those described using FIGS. 9 to 17 will be mainly described.

Referring to FIG. 21, in the method for fabricating the semiconductor device according to example embodiments, the etching stop film 105, the first mold layer 210, the first supporter pattern 131, the second mold layer 220, the first buffer structure 225, the second supporter pattern 132, the second buffer structure 235, the third mold layer 230, the third supporter pattern 133, the first mask film 250, and the second mask film 260 may be sequentially formed on the interlayer insulating film 102. For example, the second buffer structure 235 may be formed above the second supporter pattern 132, and the first buffer structure 225 may be formed below the second supporter pattern 132 in the second direction DR2.

The description of the first buffer film 226 and the second buffer film 227 may be substantially the same as the description of the first buffer film 226 and the second buffer film 227 described using FIGS. 9 to 17. The description of the third buffer film 236 and the fourth buffer film 237 may be substantially the same as the description of the third buffer film 236 and the fourth buffer film 237 described using FIGS. 20A and 20B.

The second mold layer 220 may include a first film 221 including no nitrogen and a second film 222 including nitrogen. FIGS. 10 and 11 may be schematic graphs showing the concentration of nitrogen along a line B of FIG. 20A.

Alternatively, unlike that shown, the second mold layer 220 of FIG. 21 may be the second mold layer 220 of FIGS. 18 and 19.

The semiconductor device of FIGS. 1 and 5 may be formed by the fabricating method described using FIGS. 12 to 17.

In concluding the detailed description, those skilled in the art will appreciate that many variations and modifications may be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A semiconductor device comprising:

a first pad disposed on a substrate extending in a first direction and a second direction, perpendicular to the first direction;

a lower electrode connected to and disposed on the first pad;

a first supporter layer, a second supporter layer, and a third supporter layer each disposed on a side wall of the lower electrode and sequentially spaced apart from each other in a third direction perpendicular to the first direction and the second direction;

a dielectric film disposed on the lower electrode and the first, second, and third supporter layers; and an upper electrode disposed on the dielectric film, wherein at least one of a side wall of the lower electrode between the first supporter layer and the second supporter layer, and a side wall of the lower electrode between the second supporter layer and the third supporter layer includes a first portion including protrusions extending in the first direction and includes a second portion including no protrusions, and wherein each of bottom surfaces of the first, second, and third supporter layers is at a higher level than a bottom surface of the lower electrode in the third direction.

2. The semiconductor device of claim 1, wherein the second portion is flat.

3. The semiconductor device of claim 1, wherein a width, in the first direction, of the lower electrode having the second portion increases or is constant along the third direction.

4. The semiconductor device of claim 1, wherein the side wall of the lower electrode between the first supporter layer and the second supporter layer includes the second portion and the first portion disposed above the second portion.

5. The semiconductor device of claim 4, wherein the side wall of the lower electrode between the second supporter layer and the third supporter layer is flat.

6. The semiconductor device of claim 1, wherein the side wall of the lower electrode between the second supporter layer and the third supporter layer includes the first portion, and the second portion disposed above the first portion.

7. The semiconductor device of claim 6, wherein the side wall of the lower electrode between the first supporter layer and the second supporter layer is flat.

8. The semiconductor device of claim 1, wherein the side wall of the lower electrode between the first pad and the first supporter layer is flat.

9. The semiconductor device of claim 1, wherein a length of the lower electrode in the third direction is greater than a width of the lower electrode in the first direction.

10. The semiconductor device of claim 1, wherein the lower electrode includes a first extension extending in the first direction along an upper surface of the first pad, and a second extension protruding from one end of the first extension and extending in the third direction.

11. A semiconductor device comprising:

a trench inside a substrate extending in a first direction and a second direction, perpendicular to the first direction;

a gate electrode that fills a part of the trench;

a storage contact which is disposed on at least one side of the gate electrode and connected to the substrate;

a first pad on the storage contact;

an etching stop film disposed on and covering a portion of the first pad;

a lower electrode which penetrates the etching stop film and is connected to the first pad;

a first supporter layer disposed on a side wall of the lower electrode and spaced apart, in a third direction perpendicular to the first and second directions, from the etching stop film;

a second supporter layer disposed on the first supporter layer and spaced apart, in the third direction, from the first supporter layer;

a third supporter layer disposed on the second supporter layer and spaced apart, in the third direction, from the second supporter layer;

a dielectric film which extends along an upper surface and a side wall of the lower electrode, and upper surfaces and lower surfaces of the first to third supporter layers; and an upper electrode disposed on the dielectric film, wherein the side wall of the lower electrode between the first supporter layer and the second supporter layer includes a first lower portion and a first upper portion on the first lower portion, wherein the side wall of the lower electrode between the second supporter layer and the third supporter layer includes a second lower portion and a second upper portion on the second lower portion, wherein at least one of the first upper portion and the second lower portion includes a plurality of protrusions protruding from the side wall of the lower electrode, and wherein the second upper portion and the first lower portion are flat.

12. The semiconductor device of claim 11, wherein a width, in the first direction, of the lower electrode having the second upper portion and the first lower portion increases or is constant along the third direction.

13. The semiconductor device of claim 11, wherein the side wall of the lower electrode between the etching stop film and the first supporter layer is flat.

14. The semiconductor device of claim 11, wherein the upper surface of the third supporter layer is disposed on the same plane as the upper surface of the lower electrode.

15. The semiconductor device of claim 11, wherein a distance between the etching stop film and the first supporter layer is greater than a distance between the first supporter layer and the second supporter layer, and a distance between the second supporter layer and the third supporter layer.

16. A semiconductor device comprising:

a first pad disposed on a substrate extending in a first direction and a second direction, perpendicular to the first direction;

a lower electrode connected to and disposed on the first pad;

a first supporter layer, a second supporter layer, and a third supporter layer each disposed on a side wall of the lower electrode and sequentially spaced apart from each other in a third direction perpendicular to the first direction and the second direction;

a dielectric film disposed on the lower electrode and the first, second, and third supporter layers; and an upper electrode disposed on the dielectric film, wherein at least one of a side wall of the lower electrode between the first supporter layer and the second supporter layer, and a side wall of the lower electrode between the second supporter layer and the third supporter layer includes a first portion including protrusions extending in the first direction and includes a second portion including no protrusions, and wherein the side wall of the lower electrode between the first pad and the first supporter layer is flat.

17. The semiconductor device of claim 16, further comprising a contact pattern formed on the substrate, wherein the first pad is positioned between the contact pattern and the lower electrode, and wherein a width of the lower electrode in the first direction is greater than a width of the first pad in the first direction.

18. The semiconductor device of claim 1, wherein the protrusions protrude toward the dielectric film.

\* \* \* \* \*